United States Patent
Tanaka et al.

(10) Patent No.: US 8,736,956 B2
(45) Date of Patent: May 27, 2014

(54) OPTICAL AMPLIFICATION CONTROL APPARATUS

(75) Inventors: Shinsuke Tanaka, Kawasaki (JP); Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 380 days.

(21) Appl. No.: 13/048,345

(22) Filed: Mar. 15, 2011

(65) Prior Publication Data

US 2011/0164310 A1    Jul. 7, 2011

Related U.S. Application Data

(63) Continuation of application No. PCT/JP2008/002789, filed on Oct. 3, 2008.

(51) Int. Cl.
*H01S 5/024* (2006.01)
*H01S 3/10* (2006.01)

(52) U.S. Cl.
USPC .......................................... 359/344; 359/337

(58) Field of Classification Search
USPC ................... 359/344, 341.41, 341.42, 337
See application file for complete search history.

(56) References Cited

U.S. PATENT DOCUMENTS

| | | | | |
|---|---|---|---|---|
| 5,337,176 | A | * | 8/1994 | Tiemeijer ........................ 359/344 |
| 6,104,526 | A | * | 8/2000 | Kakui ............................. 359/337 |
| 2002/0122245 | A1 | | 9/2002 | Morito |

FOREIGN PATENT DOCUMENTS

| | | |
|---|---|---|
| JP | 4-025822 A | 1/1992 |
| JP | 4-25822 A | 1/1992 |
| JP | 9-074250 A | 3/1997 |
| JP | 2000-232251 A | 8/2000 |
| JP | 2000-244458 A | 9/2000 |
| JP | 3267263 B2 | 3/2002 |
| JP | 2002-208758 A | 7/2002 |
| JP | 2002-237784 A | 8/2002 |
| JP | 2003-023208 A | 1/2003 |
| JP | 2006-114774 A | 4/2006 |
| WO | 00/79655 A1 | 12/2000 |
| WO | 02/093701 A1 | 11/2002 |
| WO | 02/101426 A2 | 12/2002 |

OTHER PUBLICATIONS

Japanese Office Action dated Jan. 8, 2013, issued in corresponding Japanese Patent Application No. 2010-531658, w/ English translation.
Chinese Office Action dated Jul. 3, 2012, issued in corresponding Chinese Patent Application No. 200880131443.7, w/ English translation.
Chinese Office Action dated Mar. 13, 2013, issued in corresponding Chinese Patent Application No. 200880131443.7, w/ English translation.
International Search Report of PCT/JP2008/002789, mailing date Oct. 28, 2008.

(Continued)

*Primary Examiner* — Mark Hellner
(74) *Attorney, Agent, or Firm* — Westerman, Hattori, Daniels & Adrian, LLP

(57) ABSTRACT

An optical amplification control apparatus is formed from a semiconductor optical amplifier, a temperature adjustment unit adjusting the temperature of the semiconductor optical amplifier, and an optical gain control unit adjusting the temperature of the semiconductor optical amplifier by controlling the temperature adjustment unit, and varying an optical gain of the semiconductor optical amplifier. Thus, a pattern effect is suppressed even if the output light intensity (the intensity of amplified light) is increased.

5 Claims, 30 Drawing Sheets

(56) References Cited

OTHER PUBLICATIONS

Tiemeijer, L.F. et al "Temperature Dependence of a 1300 nm Polarization-Insensitive Multiple Quantum Well Laser Amplifier and Its Implications for the Ultimate Capacity of Cascaded Amplifier System," IEEE Photonics Technology Letter, Nov. 1994, vol. 6 No. 11, pp. 1300-1302.

United Kingdom Office Action dated of mailing Jun. 3, 2013, issued in United Kingdom Application No. GB1105536.5 (5 pages).

United Kingdom Office Action dated Aug. 15, 2013, issued in corresponding United Kingdom Patent Application No. 1105536.5.

* cited by examiner

FIG.6

| TARGET OPTICAL GAIN (dB) | 12 | 11 | 10 | 8 |
|---|---|---|---|---|
| SET CURRENT (mA) | 300 | 300 | 300 | 300 |
| SET TEMPERATURE (°C) | 25 | 40 | 50 | 60 |

FIG.24

| TARGET OPTICAL GAIN (dB) | 12 | 11 | 10 | 9 |
|---|---|---|---|---|
| SET CURRENT (mA) | 300 | 300 | 300 | 300 |
| SET HEATER CURRENT (mA) | 0 | 150 | 250 | 350 |

OPTICAL AMPLIFICATION CONTROL APPARATUS

CROSS-REFERENCE TO RELATED APPLICATION

This application is a continuation of International Application No. PCT/JP2008/002789, filed on Oct. 3, 2008, herein incorporated by reference.

FIELD

The present invention relates to an optical amplification control apparatus, a method for controlling a semiconductor optical amplifier, and optical transmission equipment.

BACKGROUND

Optical communication technology having features of large capacity and high speed has been widely used hitherto for the implementation of a backbone network.

In recent years, as communication demand remarkably increases, the optical communication technology comes to be used for the implementation of an access network in an urban area, that is, a metro access network.

Furthermore, it has been started to apply the optical communication technology to data transmission (so-called datacom) between information processing apparatuses (servers, for example) which are installed in an identical room.

In such the metro access network and the datacom, a large number of optical devices (semiconductor laser, light receiver, optical amplifier, etc.) are used to implement the networks. Therefore, to advance the metro access network and the datacom, it is important to reduce the size and cost of modules on which such the optical devices are mounted.

The optical amplifier is an essential optical device to implement the optical network. As the optical amplifier, an optical fiber amplifier has been put into practical use, and is used in the backbone network. However, an optical fiber amplifier module, having a unified structure of the optical fiber amplifier with a control apparatus therefor, has a complicated configuration, which makes it difficult to achieve miniaturization and cost reduction.

In contrast, in regard to a semiconductor optical amplifier module having a unified structure of a semiconductor optical amplifier (hereafter abbreviated as SOA) with a control apparatus therefor, it is easy to achieve miniaturization and cost reduction.

Accordingly, the implementation of a next-generation access network and a datacom using the semiconductor optical amplifier module is under study.

As a way of using the optical amplifier in optical communication, there are two ways, namely, constant output control (auto power control; APC) and constant gain control (auto gain control; AGC).

The constant output control is a control method of the optical amplifier to output amplified light continuously having constant intensity, irrespective of variation in input light intensity. As the variation factors of the input light intensity, there are light source output variation and wavelength switchover.

The constant gain control is a control method of the optical amplifier to amplify input light with a continuously constant gain, irrespective of variation in the polarization direction and the wavelength of the input light. As the variation factor of the polarization direction of the input light, there is a state change of an optical fiber transmission path. Also, as the variation factor of the input light wavelength, there is a wavelength switchover at the light source, or the like.

In any control mode, desired control (APC or AGC) is achieved by adjusting the gain of the semiconductor optical amplifier synchronously with the variation of the input light.

The gain of the semiconductor optical amplifier varies with the magnitude of a current (drive current) supplied to the semiconductor optical amplifier. The larger the drive current is, the lager the optical gain becomes, while the smaller the drive current is, the smaller the optical gain becomes. By use of the above character, the gain of the semiconductor optical amplifier is adjusted, and thus the control like APC is achieved.

Additionally, in order to operate a semiconductor optical device such as the semiconductor optical amplifier and the semiconductor laser, it is necessary to control device temperature. Such the temperature control is carried out by a thermoelectric cooling device (peltier device), having the semiconductor optical device mounted thereon, or a heater mounted on the semiconductor optical device.

Patent document 1: Japanese Laid-open Patent Publication No. 2000-244458.

Patent document 2: Japanese Laid-open Patent Publication No. 2000-232251.

Patent document 3: Japanese Laid-open Patent Publication No. 2002-237784.

Patent document 4: Japanese Laid-open Patent Publication No. 2003-23208.

DISCLOSURE OF THE INVENTION

Problems to be Solved by the Invention

However, when the drive current is varied, the saturation optical output power of the semiconductor optical amplifier is also varied, simultaneously with the variation of the optical gain.

When the drive current amplifies light at a content state, the magnitude of the optical gain is constant while the light intensity of the input light is small. However, when the light intensity of the input light becomes larger, the optical gain is gradually decreased. As a result, the light intensity of the output light is saturated. The value at this time is the saturation optical output power.

Similar to the optical gain, the saturation optical output power of the semiconductor optical amplifier is increased when the drive current is increased, and is decreased when the drive current is decreased.

Now, when the light output power of the semiconductor optical amplifier is increased and approaches the saturation optical output power, the semiconductor optical amplifier becomes unable to follow the input light which varies at high speed (for example, 1 GHz or higher). As a result, there occurs a so-called pattern effect, in which the waveform of the output light (hereafter referred to as amplified light) of the semiconductor optical amplifier is deformed. For the semiconductor optical amplifier, the pattern effect which varies the waveform of the optical signal is an important issue which must be avoided.

To avoid the pattern effect, it is effective to operate the semiconductor optical amplifier at an output level sufficiently smaller than the saturation optical output power value.

However, as described earlier, when the drive current of the semiconductor optical amplifier is varied to vary the optical gain, the saturation optical output power is also varied simultaneously. For this reason, in order to prevent the occurrence of the pattern effect, it is necessary to operate the semiconductor optical amplifier at a sufficiently smaller output level than the minimum value of the varied saturation optical output power value.

As a result, the output level is inevitably limited to a small value if it is intended to amplify a high speed optical signal (for example, 1 GHz or higher) by the semiconductor optical amplifier.

Accordingly, the objective of the present optical amplification control apparatus is to provide an optical amplification control apparatus capable of suppressing (or avoiding) the pattern effect simultaneously with the increase of the output light intensity (amplified light intensity), for a high speed optical signal (for example, 1 GHz or higher).

Solution to Problem

To achieve the above-described objects, the optical amplification control apparatus includes a semiconductor optical amplifier; a temperature adjustment unit adjusting a temperature of the semiconductor optical amplifier; and an optical gain control unit adjusting the temperature of the semiconductor optical amplifier by controlling the temperature adjustment unit, and varying an optical gain of the semiconductor optical amplifier.

Effect of the Invention

According to the present amplification control apparatus, it is possible to suppress (or avoid) the pattern effect and, at the same time, to increase output light intensity (amplified light intensity) even when a high-speed optical signal (for example, 1 GHz or higher) is amplified.

BRIEF DESCRIPTION OF THE DRAWINGS

FIG. 6 is one example of a lookup table recorded in the optical gain control unit according to Embodiment 1.

FIG. 24 is one example of a lookup table recorded in the optical gain control unit according to Embodiment 5.

EXPLANATION OF LETTERS OR NUMERALS

Figure 1:
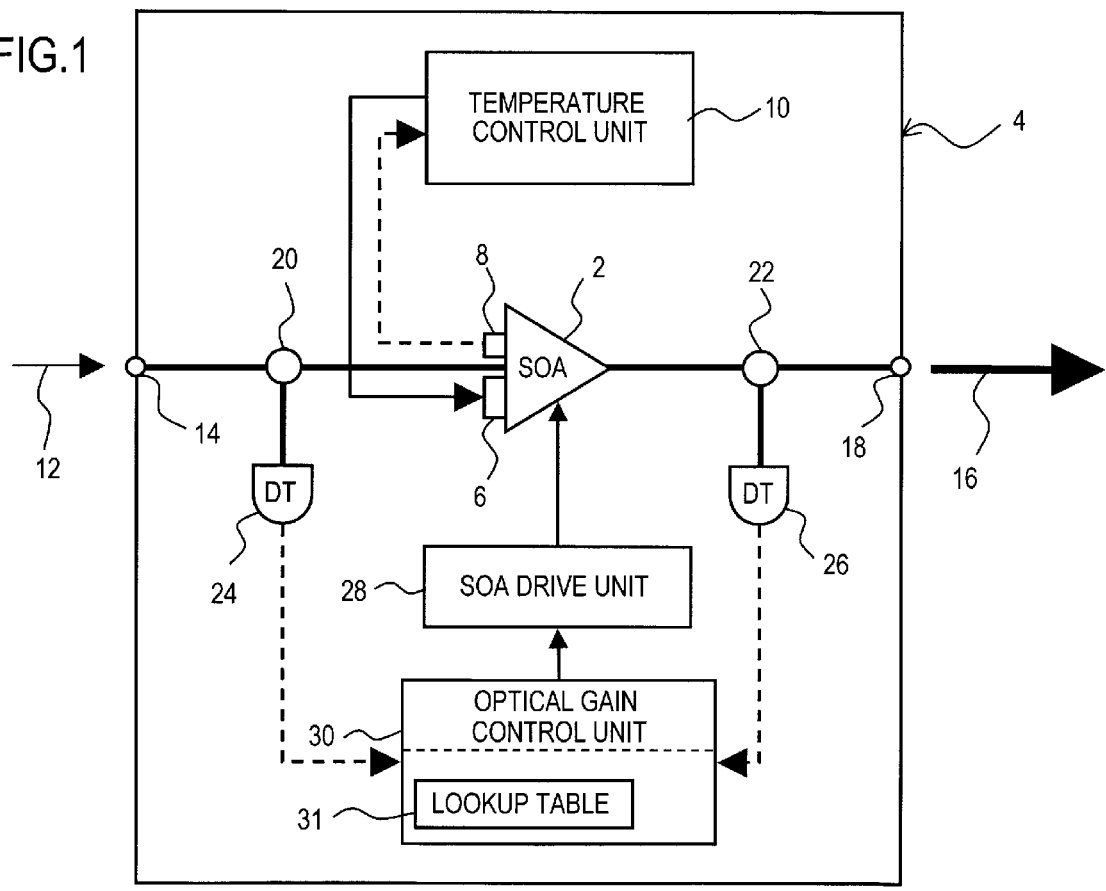
FIG. 1 is a block diagram illustrating the configuration of an optical amplification control apparatus for adjusting the gain of a semiconductor optical amplifier by varying a drive current (related technology).

2: Semiconductor optical amplifier
4: Optical amplification control apparatus (Drive-current control type)
6: Thermoelectric cooling device
8: Temperature sensor
10: Temperature control unit
12: Input light 14: Input terminal
16: Output light
18: Output terminal
20: Optical splitter on the input side
22: Optical splitter on the output side
24: Photodetector on the input side
26: Photodetector on the output side
28: SOA drive unit
30: Optical gain control unit
31: Lookup table
32: Optical amplification control apparatus (Embodiment 1)
33: Active layer
34: Optical gain control unit (Embodiment 1)
35: Lookup table (Embodiment 1)
36: Cooling/heating unit
38: External control signal
40: Optical amplification control apparatus (Embodiment 2)
42: Optical amplification control apparatus (Embodiment 2)
44: Lookup table (Embodiment 2)
46: Optical amplification control apparatus (Embodiment 3)
48: Optical gain control unit (Embodiment 3)
50: Lookup table (Embodiment 3)
52: Optical amplification control apparatus (Embodiment 4)
54: Optical gain control unit (Embodiment 4)
56: Lookup table (Embodiment 4)
58: Optical amplification control apparatus (Embodiment 5)
60: Heater
62: Cooling/heating unit (Embodiment 5)
64: Heater drive unit
66: Optical gain control unit (Embodiment 5)
68: Lookup table (Embodiment 5)
70: First electrode
72: n-type InP substrate
74: Upper clad layer
76: Electrode layer
78: Second electrode
80: Antireflection film
82: First p-type InP layer
84: n-type InP layer
86: Second p-type InP layer
88: p-n-p current block layer
90: Insulating film
92: Heater main body
94: Heater electrode
96: Incident end of light
98: Output end of light
100: Heater (divided heater)
102: Heater on the light input end side
104: Inner heater
106: Heater on the light output end side
108: Optical transmission equipment
110: Output optical signal
112: Optical transmitter
114: Incident optical signal
116: Optical receiver
118: First optical amplification control apparatus
120: Second optical amplification control apparatus
122: Transmission data signal (electric signal)
124: Received data signal (electric signal)
126: Control unit
128: External control signal
130: Optical wavelength filter

BEST MODE CARRYING OUT THE INVENTION

Hereafter, embodiments of the present invention will be described according to the drawings. However, the technical scope of the present invention is not limited to the embodiments described, but instead extends to the matters described in the claims and the equivalents thereof.

[Drive-current Controlled Optical Amplification Control Apparatus]

First, an optical amplification control apparatus (hereafter referred to as drive-current control led optical amplification control apparatus) for controlling the gain of a semiconductor optical amplifier by varying a drive current will be described.

(1) Configuration of the Apparatus

Figure 2:
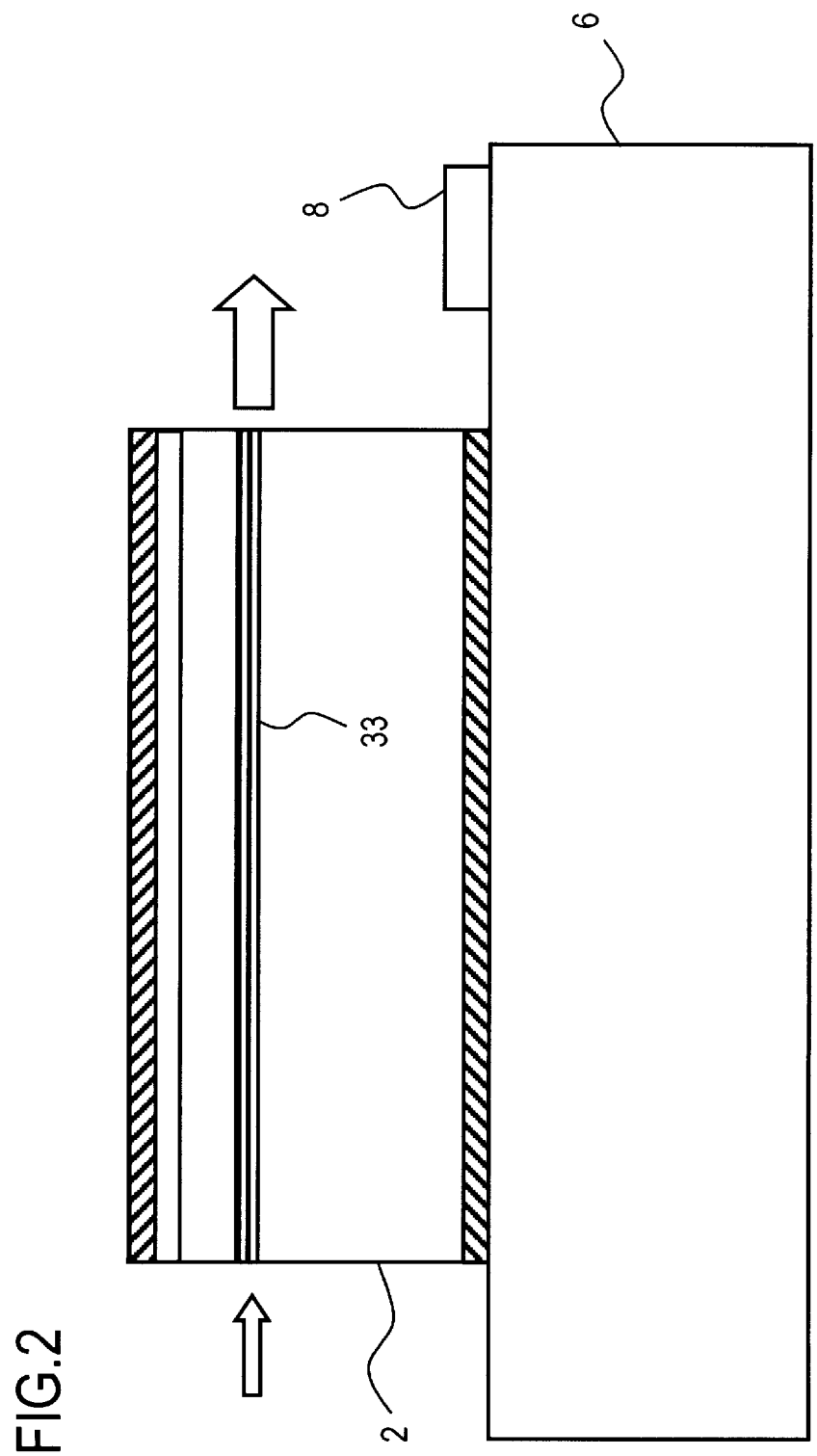
FIG. 2 is a diagram illustrating a state that the semiconductor optical amplifier (SOA) is mounted on a thermoelectric cooling device (peltier device).

FIG. 1 is a block diagram illustrating the configuration of an optical amplification control apparatus (optical amplifier module) 4 for adjusting the gain of a semiconductor optical amplifier (SOA) 2 by the variation of the drive current. FIG. 2 is a diagram illustrating a state that the SOA 2 is mounted on a thermoelectric cooling device 6 (peltier device). Here, an identical symbol is added to each corresponding part even in different drawings, and thereafter the explanation thereof will be omitted.

As depicted in FIG. 1, the optical amplification control apparatus 4 includes the SOA 2, the thermoelectric cooling device (peltier device) 6 having the SOA 2 mounted thereon, and a temperature sensor 8 attached to the thermoelectric cooling device 6. The optical amplification control apparatus also includes a temperature control unit 10 for feedback-controlling the temperature of the SOA 2 using the output of the temperature sensor 8 as a feedback signal, and an SOA drive unit 28 (power supply) for driving the SOA 2.

Further, the optical amplification control apparatus 4 includes an input terminal 14 to which an input light 12 is incident, and an output terminal 18 for outputting an output light 16. Also, the optical amplification control apparatus 4 includes an optical splitter 20 on the input side for splitting a portion of the input light 12, and an optical splitter 22 on the output side for splitting a portion of the amplified light of the SOA 2.

Further, the optical amplification control apparatus 4 includes a photodetector 24 on the input side for supervising the intensity of the input light by receiving the input light 12 split by the optical splitter 20 on the input side, and a photodetector 26 on the output side for supervising the intensity of the amplified light by receiving the amplified light split by the optical splitter 22 on the output side.

Further, the optical amplification control apparatus 4 includes an optical gain control unit 30 for receiving the output of the photodetector 24 on the input side and the output of the photodetector 26 on the output side, and for controlling the SOA drive unit 28 based on the above result.

In order that the SOA 2 is operated at a target optical gain, the optical gain control unit 30 includes a lookup table 31 to specify a drive current value to be supplied to the SOA 2.

Here, as depicted in FIG. 2, the SOA 2 is mounted on the thermoelectric cooling device 6, and the temperature sensor 8 is mounted in the immediate vicinity of the SOA 2. Therefore, temperature detected by the temperature sensor 8 may be regarded as the temperature of the SOA 2.

Now, in the semi conductor optical amplifier (SOA), normally, a modulated signal light is incident. Therefore, unless otherwise stated, the input light (light to be amplified) and the output light (amplified light) to/from the semiconductor optical amplifier are modulated light having the repetition of ON and OFF. Also, when the light intensity of the input light (or the output light) of the semiconductor optical amplifier is mentioned, the light intensity signifies an average value of instantaneous light intensity over a sufficiently longer time (1 ms to 1 s, for example) than the modulation period, unless otherwise stated.

(2) Operation

Next, the operation of the optical amplification control apparatus 4 will be described according to the control method of the semiconductor optical amplifier (SOA 2). Here, a case of performing APC control of the SOA 2 is described.

First, the temperature control unit 10 detects the output of the temperature sensor 8, and by using the output thereof as a feedback signal, feedback-controls the thermoelectric cooling device 6. As described earlier, the temperature detected by the temperature sensor 8 may be regarded as the temperature of the SOA 2. Accordingly, through the feedback control of the temperature control unit 10, the temperature of the SOA 2 is retained at a constant value (for example, 25° C.) (step 1).

Next, from an external control signal, the optical gain control unit 30 reads a target value $I_{tg}$ (average value) of the output light intensity of the amplified light which is to be output from the SOA 2.

Also, the optical gain control unit 30 detects the output of the photodetector 24 on the input side, and based on the output thereof, detects light intensity $I_{in}$ (average value) of the light to be amplified which is incident to the SOA 2 (step 2).

Next, from the ratio ($=I_{tg}/I_{in}$) of the target value $I_{tg}$ of the output light intensity of the amplified light to the light intensity $I_{in}$ of the light to be amplified, the optical gain control unit 30 determines the target value $g_{tg}$ of the optical gain to be produced in the SOA 2 (step 3).

Next, by referring to the lookup table 31, the optical gain control unit 30 determines a drive current J (to be supplied to the SOA 2) corresponding to the above target value $g_{tg}$ of the optical gain (step 4).

Next, by instructing the SOA drive unit 28 to supply the drive current J to the SOA 2, the optical gain control unit 30 supplies the drive current J to the SOA (step 5).

Through the above procedure, the amplified light of which light intensity is substantially coincident with the target value $I_{tg}$ is output from the SOA 2.

Next, the optical gain control unit 30 detects the output of the photo detection 26 on the output side, and based on the output thereof, detects light intensity $I_{out}$ (average value) of the amplified light being output from the SOA 2.

By using the above light intensity $I_{out}$ of the amplified light as a feedback signal, the optical gain control unit 30 feedback-controls the drive current of the SOA 2 in such a manner that the light intensity $I_{out}$ of the amplified light coincides with the target value $I_{tg}$. At this time also, the drive current of the SOA 2 is supplied by the SOA drive unit 28. The above feedback control is continued until a stop instruction is issued to the optical gain control unit 30 by the external control signal (step 6).

By the above feedback control, the amplified light intensity which comes to have a value close to the target value $I_{tg}$ in step 5 becomes substantially coincident with the target value $I_{tg}$. Further, even when the intensity of the input light 12 varies, the light intensity of the amplified light is maintained at the target value $I_{tg}$.

Next, by referring to the amplification characteristic etc. of the SOA 2, the operation of the drive-current controlled optical amplification control apparatus will be described.

Figure 3:
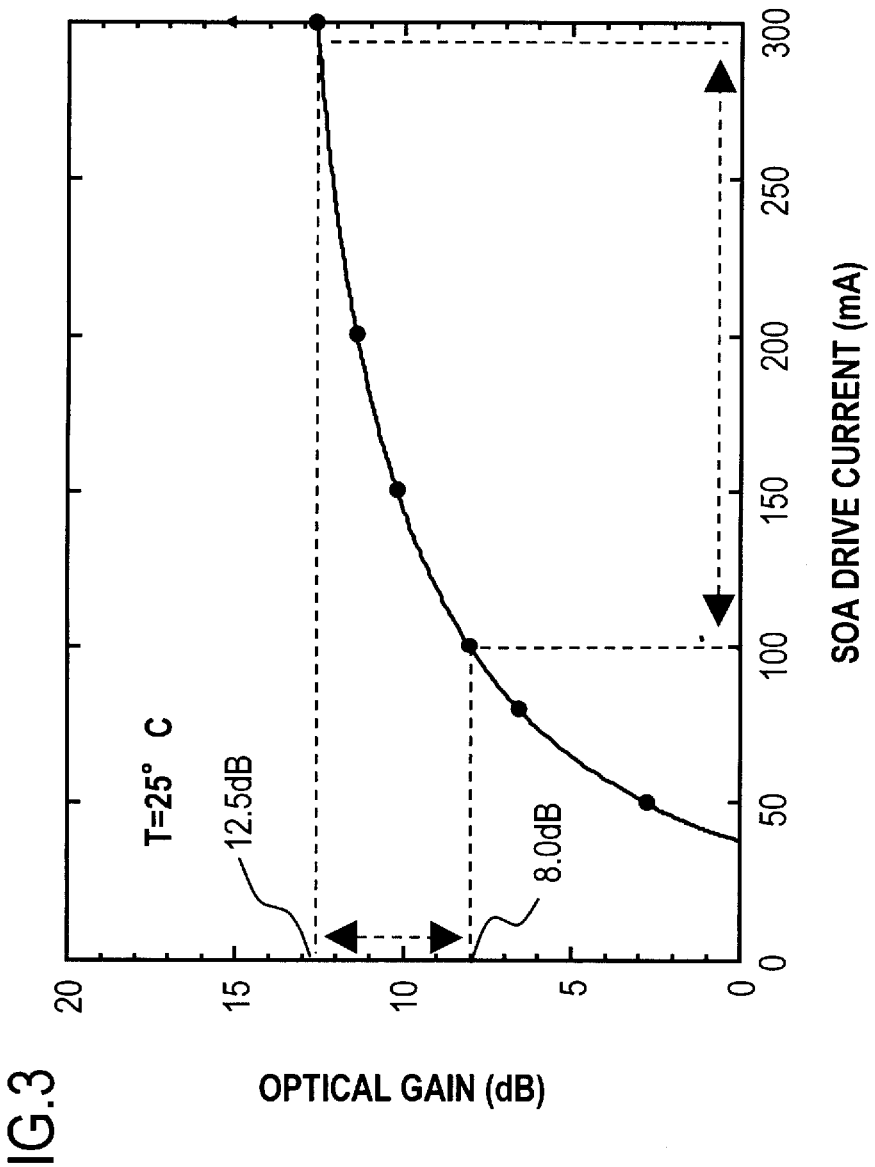
FIG. 3 is a diagram illustrating the variation of the optical gain of the SOA relative to the drive current.

FIG. 3 is a diagram illustrating the variation of the optical gain (an intensity ratio between the input light and the output light) of the SOA 2 relative to the drive current. The horizontal axis is the drive current, and the vertical axis is the optical gain. The unit of the horizontal axis is mA, and the unit of the vertical axis is dB.

The SOA used in the measurement is a traveling-wave semiconductor optical amplifier having an active layer composed of an InGaAsP multiple quantum well formed on an InP substrate. The peak wavelength of the gain exists in the vicinity of 1,480 nm. The measurement temperature is 25° C. The drive current varies in the range of 50 mA to 300 mA. Here, the maximum value 300 mA of the drive current is 15-20 kA/cm$^2$ when converted into current density.

The wavelength of the input light used in the gain measurement is 1,550 nm, and polarization direction is TE (Transverse Electric) direction. Also, the input light (light to be amplified) is a continuous wave light. The measurement of the optical gain was carried out by use of an input light of low light intensity which does not cause gain saturation in the SOA to be measured. In addition, basically, the SOA amplification characteristic is not changed whichever the input light may be a continuous wave light or a modulated light.

Although it is hard to understand immediately from FIG. 3 because the vertical axis is represented in the logarithmic scale, the optical gain increases superlinearly while the drive current is small, and the optical gain is saturated when the drive current becomes large.

As such, the optical gain increases as the drive current increases, and decreases as the drive current decreases. By use of this character, the optical gain control unit 30 feedback-controls the optical gain of the SOA 2.

Namely, when the amplified light intensity is smaller than the target value $I_{tg}$, the optical gain control unit 30 increases the optical gain by increasing the drive current. On the other hand, when the amplified light intensity is greater than the target value $I_{tg}$, the optical gain control unit 30 decreases the optical gain by decreasing the drive current. By the repetition of the above operation, the amplified light intensity approaches the target value $I_{tg}$.

Additionally, the feedback control is carried out using the average value of the light intensity of the amplified light as a feedback signal. Also, the mark ratio of the input light 12 is normally maintained constant. Therefore, not only the average value but the peak value of the amplified light intensity is also maintained constant.

(3) Problem

Next, a problem of the drive-current controlled optical amplification control apparatus will be described. Here, a description is given on the problem produced when the optical amplification control apparatus executes the APC control, namely maintains the output light intensity to be constant. However, a similar problem exists when the optical amplification control apparatus executes the AGC control.

When the light intensity incident to the SOA becomes large, carrier density which forms inverted population on the active layer of the SOA is decreased by stimulated emission (optical amplification), so that the amplified light intensity is saturated. Accordingly, in the state that the amplified light is saturated or nearly saturated, the carrier density in the active layer of the SOA reduces as compared to the case of non-saturation.

In such the state, once the light is intercepted, the carrier density starts increasing. Thereafter, when the light is incident to the SOA again, the increased carrier density starts decreasing again by the stimulated emission. Such variation of the carrier density causes the variation of the SOA optical gain. As a result, the waveform of the amplified light is deformed. Such the waveform deformation (so-called pattern effect) of the amplified light becomes conspicuous when the period of the optical signal approaches a time constant of the carrier lifetime, $\tau_s$.

The time constant $\tau_s$ is normally between sub-ns and several ns. Therefore, the pattern effect is conspicuous at 1 GHz or higher.

Accordingly, in the high speed optical communication which handles optical signals of which bit rates are 1 GHz or higher, the suppression of the pattern effect is an unavoidable technical issue.

To avoid the pattern effect, it is effective to suppress the decrease of the carrier density in the active layer by suppressing the amplified light intensity.

For example, in the SOA of which amplification characteristic is depicted in FIG. 3, when a modulated light having a mark ratio of 50% is input, the pattern effect is suppressed to a level which causes no problem in practical use if the amplified light intensity (average intensity) is made lower by 5 dB than saturation optical output power (the continuous wave value of the saturation optical output power when a continuous wave light is input). Hereafter, the mark ratio of the modulated light is set to 50% unless particularly mentioned.

Now, by use of the SOA of which amplification characteristic is depicted in FIG. 3 as an example, a method of avoiding the pattern effect will be typically described.

Here, consideration will be given to a case that, by referring to the lookup table 31, the optical gain control unit 30 varies the gain of the SOA 2 in the range from 8 dB to 12.5 dB.

When the optical gain control unit 30 intends to generate an optical gain of 8 dB in the SOA 2 by referring to the lookup table 31, the optical gain control unit 30 instructs the SOA drive unit 28 to inject a drive current of 100 mA into the SOA 2 (refer to FIG. 3). Meanwhile, to generate an optical gain of 12.5 dB in the SOA 2, the optical gain control unit 30 instructs the SOA drive unit 28 to inject a drive current of 300 mA into the SOA 2 (refer to FIG. 3). Namely, the drive current injected into the SOA 2 is varied between 100 mA and 300 mA.

Figure 4:
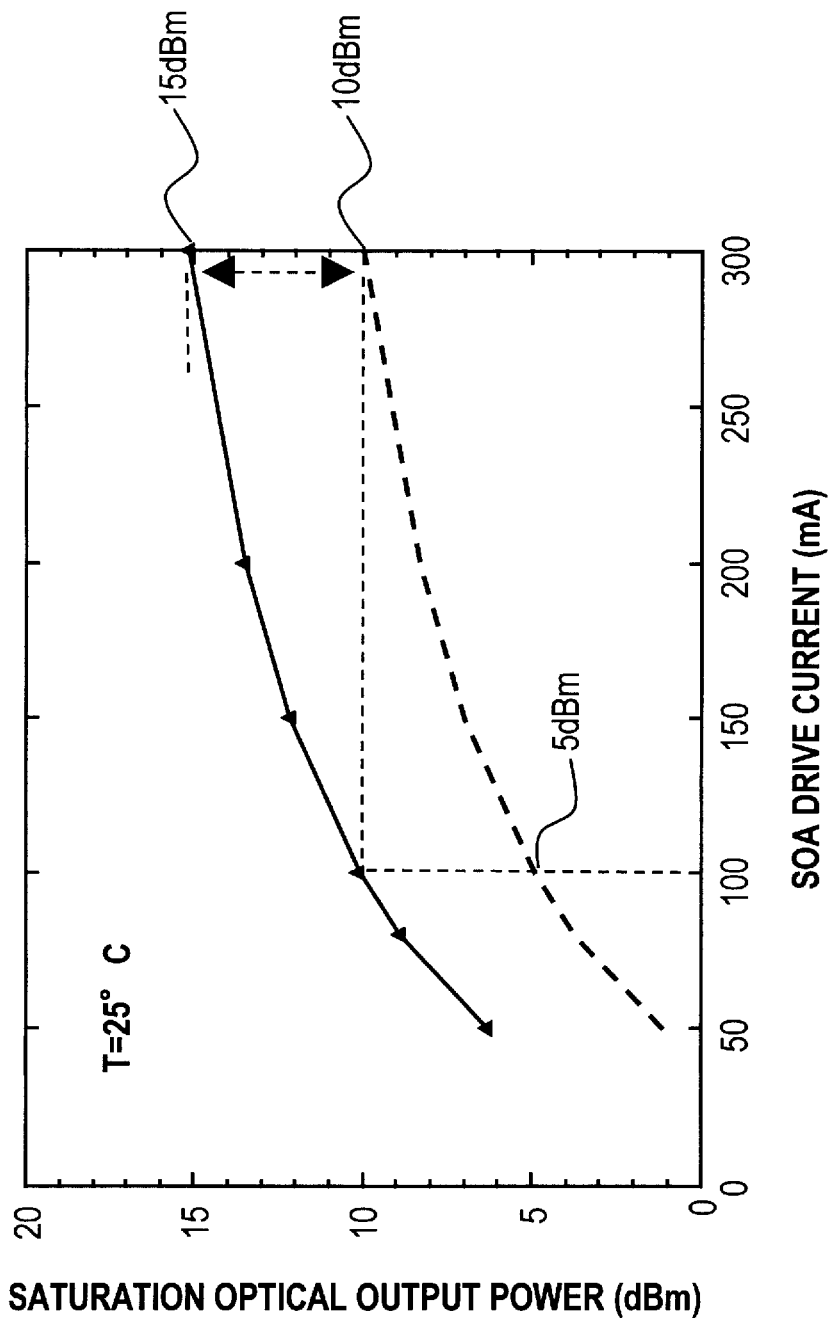
FIG. 4 is a diagram illustrating the variation of the saturation optical output power of the SOA relative to the drive current.

FIG. 4 is a diagram illustrating the variation of the saturation optical output power (a saturation optical output power value when a continuous wave light is input) of the SOA, of which amplification characteristic is depicted in FIG. 3, relative to the drive current. The measurement conditions are identical to the conditions at the time of measurement depicted in FIG. 3. A curve depicted by the solid line in FIG. 4 indicates the variation of the saturation optical output power. A curve depicted by the dotted line indicates a level which is 5 dB lower than the saturation optical output power (solid line).

The horizontal axis in FIG. 4 is the drive current, and the vertical axis is the saturation optical output power. Here, the unit of the horizontal axis is mA, and the unit of the vertical axis is dBm. Although it is not clear immediately from FIG. 4, in which the vertical axis is represented in the logarithmic scale, the saturation optical output power varies substantially linearly with the drive current.

As described above, the drive current injected to the SOA 2 is varied between 100 mA and 300 mA. At this time, in proportion to the drive current, the saturation optical output power of the SOA 2 is varied between 10 dBm and 15 dBm, as depicted in FIG. 4.

In order to avoid the waveform deformation in the optical signal, the pattern effect has to be suppressed no matter when the SOA is operated with any optical gain.

Accordingly, it is necessary that the light intensity of the SOA amplified light be suppressed to a value which is 5 dB lower than the minimum value 10 dBm of the above saturation optical output power, namely to 5 dBm (=10 dBm−5 dB). In other words, the light intensity of the output light (the target value of the output light intensity) to be retained at a constant value in the APC control has to be set to 5 dBm or lower.

However, when the optical gain is 12.5 dB (the saturation optical output power at this time is 15 dBm), even when the amplified input light becomes 10 dBm (=15 dBm−5 dB), the pattern effect does not occur. Nevertheless, the target value of the amplified output light intensity has to be set to 5 dBm or lower to fit to the case having the optical gain of 8 dB.

As such, in the method of adjusting the optical gain by the drive current, there is the problem that the intensity of the SOA output light (amplified light) has to be suppressed excessively. This problem is not only limited to the SOA, of which amplification characteristic is depicted in FIG. 3, having an active layer composed of an InGaAsP multiple quantum well. The problem is common to a general SOA.

(Embodiment 1)

The present embodiment relates to an optical amplification control apparatus for controlling an SOA gain by cooling or heating the SOA, not by varying a drive current. Here, the present optical amplification control apparatus executes APC control.

(1) Configuration

Figure 5:
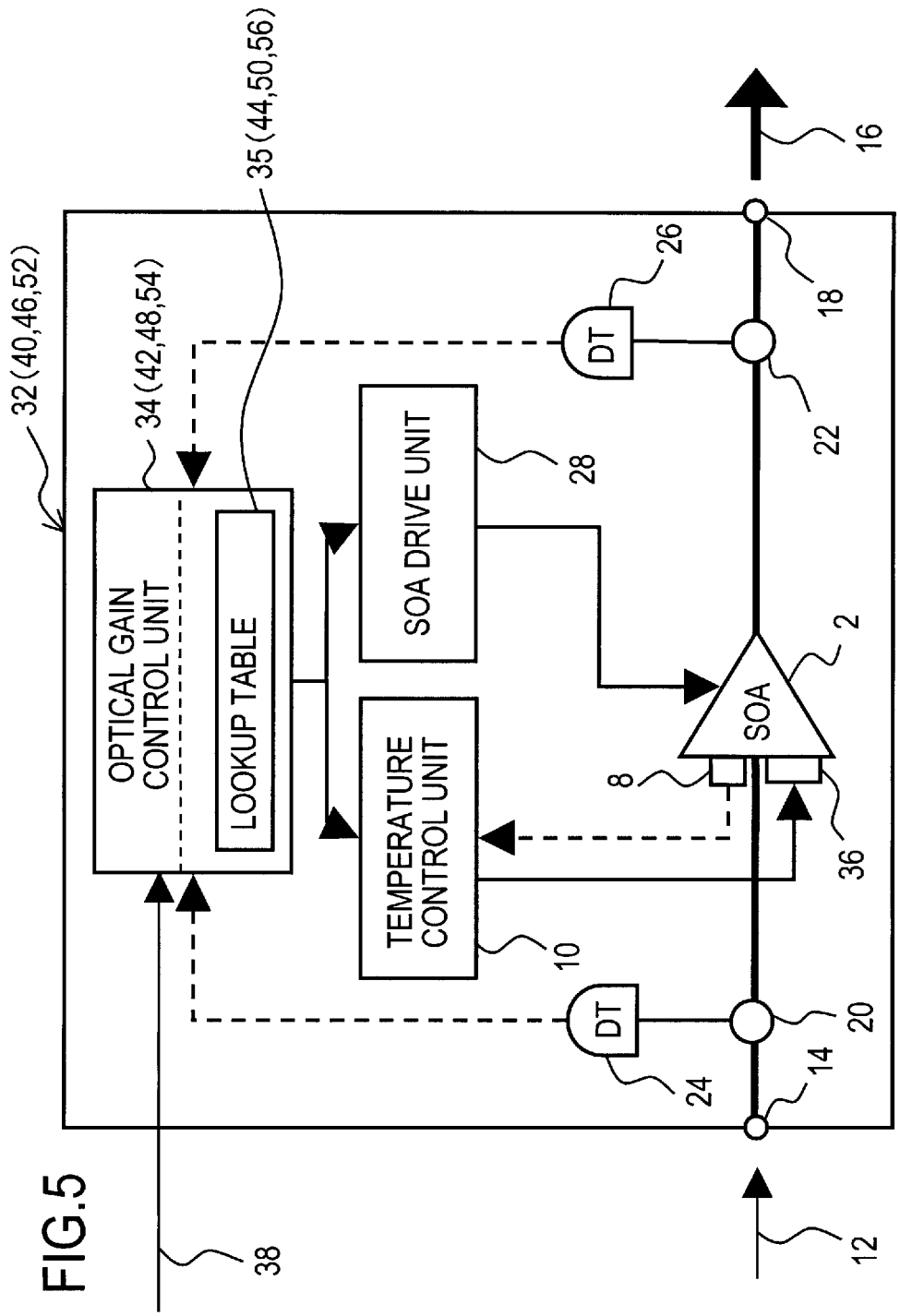
FIG. 5 is a block diagram illustrating the configuration of the optical amplification control apparatus according to Embodiment 1.

FIG. 5 is a block diagram illustrating the configuration of the optical amplification control apparatus (optical amplifier module) 32 according to the present embodiment.

As depicted in FIG. 5, the optical amplification control apparatus 32 according to the present embodiment includes a semiconductor optical amplifier (SOA) 2 for amplifying and outputting an incident light by an active layer 33 into which the drive current is injected.

The SOA 2 for use in the present embodiment is identical to the semiconductor optical amplifier (traveling wave SOA having an InGaAsP multiple quantum well as the active layer 33) of which characteristic is depicted in FIG. 3. However, it may also be possible that the SOA 2 is a semiconductor optical amplifier of various types (such as a traveling wave SOA having an active layer composed of a bulk semiconductor or quantum dots and a Fabry-Perot SOA).

Also, the optical amplification control apparatus 32 according to the present embodiment includes a cooling/heating unit 36 performing either one or both of cooling and heating the semiconductor optical amplifier 2. Here, the cooling/heating unit 36 is a kind of temperature adjustment unit for adjusting the temperature of the semiconductor optical amplifier 2.

The cooling/heating unit 36 included in the present optical amplification control apparatus 32 is composed of a thermoelectric cooling device (peltier device) having the SOA 2 mounted thereon. A state that the SOA 2 is mounted on the thermoelectric cooling device 6 is identical to the state that SOA 2 is mounted on the thermoelectric cooling device 6 in the drive-current controlled optical amplification control apparatus (refer to FIG. 2).

Also, the present optical amplification control apparatus 32 includes an optical gain control unit 34 for controlling the optical gain of the SOA 2 by adjusting the operation of the cooling/heating unit 36. The optical gain control unit 34 varies the optical gain of the SOA 2 by executing the following control. Additionally, the optical gain is a ratio of light intensity relative to the light intensity of light before amplification.

First, the optical gain control unit 34 executes first control to specify a target value ($g_{tg}$) of the optical gain which is intended to be generated by the SOA 2 (the first control).

Specifically, as the target value ($g_{tg}$) of the optical gain intended to be generated in the SOA 2, the optical gain control unit 34 determines a ratio ($=I_{tg}/I_{in}$) of a target value ($I_{tg}$) of output light intensity intended to be output from the SOA 2 relative to light intensity ($I_{in}$) of an input light (light to be amplified) incident to the SOA 2.

Next, by controlling the operation of the cooling/heating unit 36, the optical gain control unit 34 varies the optical gain of the SOA 2 so that the optical gain of the SOA 2 becomes coincident with the above target value ($g_{tg}$) of the optical gain (the second control).

Specifically, the optical gain control unit 34 operates the SOA 2 in a non-saturated output power state, and also operates the SOA 2 and the cooling/heating unit 36 with the combination of the drive current (J) of the SOA 2 and the operating point of the cooling/heating unit 36, which makes the optical gain of the SOA 2 coincide with the above target value ($g_{tg}$) of the optical gain. Here, the operating point of the cooling/heating unit 36 is the temperature (T) of the cooling/heating unit 36.

Here, the non-saturated output power state signifies a state that the light intensity of the amplified light is smaller than the saturation optical output power. To suppress the pattern effect, preferably the light intensity of the amplified light is in the non-saturated state having the light intensity of the amplified light smaller than the saturation optical output power.

To suppress the pattern effect, for example, a non-saturated state having the light intensity of the amplified light (instantaneous light intensity at the ON state) 1 dB, or beyond, smaller than the saturation optical output power is preferable. Further, a non-saturated state having the above light intensity of 3 dB or beyond smaller is more preferable, and a non-saturated state having the light intensity of 5 dB or beyond smaller is the most preferable (which are also applicable in the examples described later).

Accordingly, to the modulated light having the mark ratio of 50%, a non-saturated state having the average light intensity of the amplified light 4 dB, or beyond, smaller than the saturation optical output power is preferable. Further, a non-saturated state having the above average light intensity 6 dB or beyond smaller is more preferable, and a non-saturated state having the average light intensity 8 dB or beyond smaller is the most preferable.

Next, while keeping the drive current of the SOA 2 fixed, the optical gain control unit 34 feedback-controls the operation of the cooling/heating unit 36, using the operating state (specifically, the output light intensity) of the SOA 2 as a feedback signal (the third control).

More specifically, while keeping the drive current of the SOA 2 fixed, the optical gain control unit 34 feedback-controls the operation of the cooling/heating unit 36 so that the output light intensity ($I_{out}$) output from the SOA 2 becomes coincident with the target value ($I_{tg}$) of the output light intensity. At this time, the output light intensity ($I_{out}$) output from the SOA 2 is used as the feedback signal.

In order to execute the above second control, the optical gain control unit 34 includes a lookup table 35.

FIG. 6 is one example of the lookup table 35 recorded in the optical gain control unit 34.

In the lookup table 35, in order that the SOA 2 is operated with an optical gain to be targeted (target optical gain) in the saturated optical output power state, the combinations of the drive current (set current) to be supplied to the SOA 2 and the temperature (set temperature) at which the SOA 2 is to be retained are recorded, as depicted in FIG. 6.

The lookup table 35 is recorded in a recording medium (not depicted) included in the optical gain control unit 34.

In FIG. 6, a set current and a set temperature corresponding to each of a plurality of target optical gains are recorded. However, the drive current is constant (300 mA) irrespective of the target gain.

Figure 7:
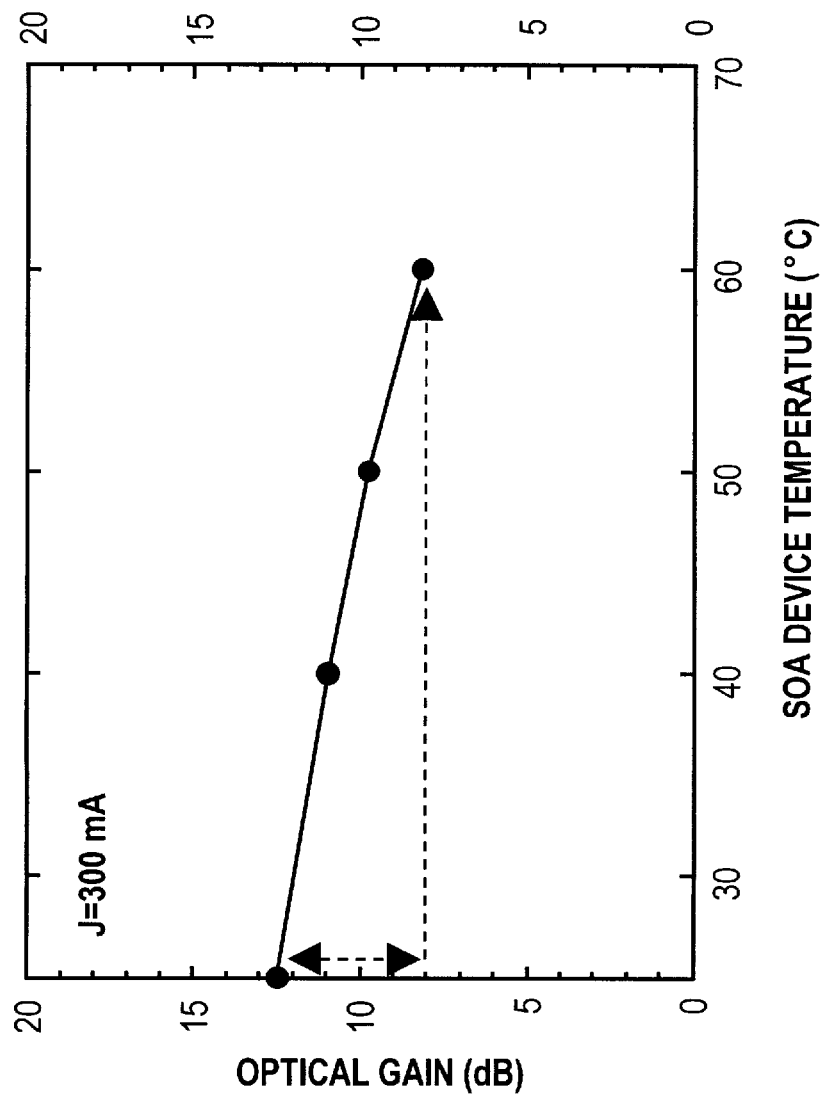
FIG. 7 is a diagram illustrating the variation of the optical gain of the SOA used in Embodiment 1, relative to the device temperature.

FIG. 7 is a diagram illustrating the variation of the optical gain of the SOA 2 relative to the device temperature. The measurement conditions of the characteristic depicted in FIG. 7 are identical to the measurement conditions used in the measurement of the optical amplification characteristic depicted in FIG. 3, except that the drive current is 300 mA and the device temperature is 25-60° C.

Figure 10:
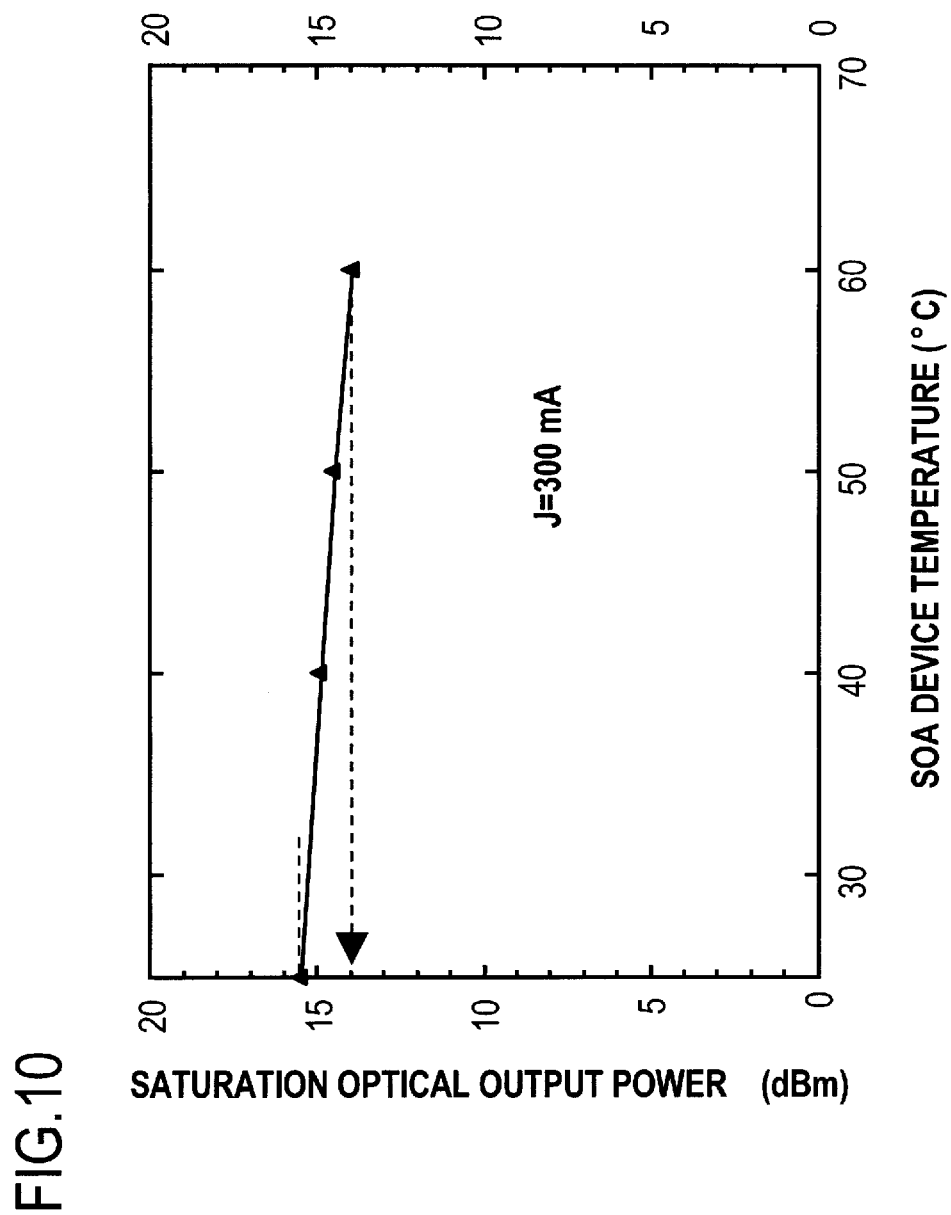
FIG. 10 is a diagram illustrating the variation of the saturation optical output power of the SOA used in Embodiment 1, relative to the device temperature.

The lookup table 35 is generated on the basis of the device temperature dependency of the optical gain depicted in FIG. 7, and the device temperature dependency of the saturation optical output power described later (refer to FIG. 10 depicted later).

As depicted in FIG. 7, the optical gain of the SOA 2 decreases as the device temperature increases. The lookup table 35 is generated on the basis of the above characteristic. Namely, a low set temperature corresponds to a high target optical gain, while a high set temperature corresponds to a low target optical gain.

Additionally, the optical gain and the saturation optical output power of the SOA depend on the polarization direction of an incident light. For this reason, the lookup table 35 is generated in consideration of the polarization dependency of both the optical gain and the saturation optical output power also. More specifically, the lookup table 35 is generated based on the characteristic (the device temperature dependency of the optical gain and the saturation optical output power) obtained when a light having a polarization direction that produces a smaller saturation optical output power in case of an identical optical gain is incident to the SOA. In other words, the lookup table 35 is generated relative to a polarization direction easy to produce the pattern effect (worst case) (in Embodiments 1 to 7 described below, each lookup table is generated based on the worst case).

Also, the present optical amplification control apparatus 32 includes a temperature sensor 8 for supervising the temperature of the SOA 2.

When the cooling/heating unit 36 is a thermoelectric cooling device (peltier device), the SOA 2 is mounted on the thermoelectric cooling device 6, and the temperature sensor 8 (for example, a negative temperature coefficient thermistor; NTC thermistor) is attached in the immediate vicinity of the SOA 2, as having been described by reference to FIG. 2. Here, as the temperature sensor, a platinum sensor, a thermocouple or the like may also be used.

Further, the present optical amplification control apparatus 32 includes a temperature control unit 10 for feedback-controlling the temperature of the SOA 2, using the output of the temperature sensor 8 as the feedback signal, and an SOA drive unit 28 (power supply) for driving the SOA 2.

Also, the present optical amplification control apparatus 32 includes an input terminal 14 (composed of an optical connector, for example) to which an input light 12 is incident, and an output terminal 18 (optical connector) from which an output light 16 is output. Further, the present optical amplification control apparatus 32 includes an optical splitter 20 (for example, a beam splitter composed of quartz) on the input side, for splitting a portion of the input light 12, and an optical splitter 22 (for example, a beam splitter composed of quartz) on the output side, for splitting a portion of the output (the amplified light) of the SOA 2.

Further, the optical amplification control apparatus 32 includes a photodetector 24 (for example, an InGaAs PIN photodiode) on the input side, for supervising the intensity of the input light by receiving the input light 12 split by the optical splitter 20 on the input side, and a photodetector 26 (for example, an InGaAs PIN photodiode) on the output side, for supervising the intensity of the amplified light by receiving the amplified light split by the optical splitter 22 on the output side.

Here, the SOA 2, the optical splitter 20 on the input side and the optical splitter 22 on the output side, the photodetector 24 on the input side and the photodetector 26 on the output side, and the optical input terminal 14 and the optical output terminal 16 are optically connected by optical fibers.

(2) Operation

Next, the operation of the present optical amplification control apparatus 32 will be described according to the control method of the SOA 2 to be executed in the present optical amplification control apparatus 32.

First, a main portion of the operation of the present optical amplification control apparatus 32 will be described.

Figure 8:
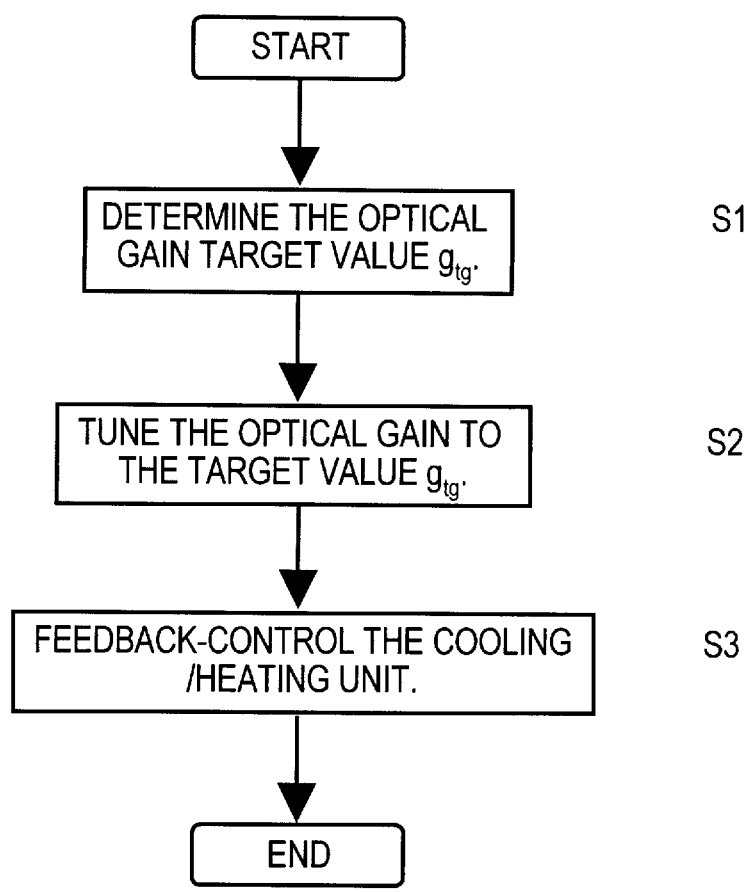
FIG. 8 is a flowchart illustrating an outline of the control procedure of the semiconductor optical amplifier in the optical amplification control apparatus, according to Embodiment 1.

FIG. 8 is a flowchart illustrating an outline of the control procedure of the semiconductor optical amplifier (SOA 2) executed in the optical amplification control apparatus 32.

Here, the following steps S1-S3 respectively correspond to the aforementioned first to the third control of the optical gain control unit 34.

First, the optical gain control unit 34 determines the target value ($g_{tg}$) of the optical gain intended to be produced in the SOA 2 (step S1).

More specifically, as the target value ($g_{tg}$) of the optical gain intended to be produced in the SOA 2, the optical gain control unit 34 determines a ratio ($=I_{tg}/I_{in}$) of the target value ($I_{tg}$) of the output light intensity to be output from the SOA 2 relative to the light intensity ($I_{in}$) of the input light incident to the SOA 2.

Next, by controlling the operation of the cooling/heating unit 36, the optical gain control unit 34 varies the optical gain of the SOA 2 so that the optical gain of the SOA 2 becomes coincident with the above target value ($g_{tg}$) of the optical gain (step S2).

More specifically, the optical gain control unit 34 operates the SOA 2 and the cooling/heating unit 36 with the combination of the drive current (J) of the SOA 2 and the operating point of the cooling/heating unit 36 by which the SOA 2 is operated in a non-saturated state and the optical gain of the SOA 2 is coincident with the above target value ($g_{tg}$) of the optical gain. Here, the operating point of the cooling/heating unit 36 is the temperature (T) of the cooling/heating unit 36.

Next, while the drive current (J) of the SOA 2 is kept fixed, the operation of the cooling/heating unit 36 is feedback-controlled, using the operating state of the SOA 2 as a feedback signal (step S3).

More specifically, while keeping the drive current (J) of the SOA 2 fixed, the optical gain control unit 34 feedback-controls the operation of the cooling/heating unit 36 in such a manner that the output light intensity output from the SOA 2 coincides with the above target value ($I_{tg}$) of the output light intensity, using the output light intensity output from the SOA 2 as the feedback signal.

Next, the detailed operation of the present optical amplification control apparatus 32 will be described.

Figure 9:
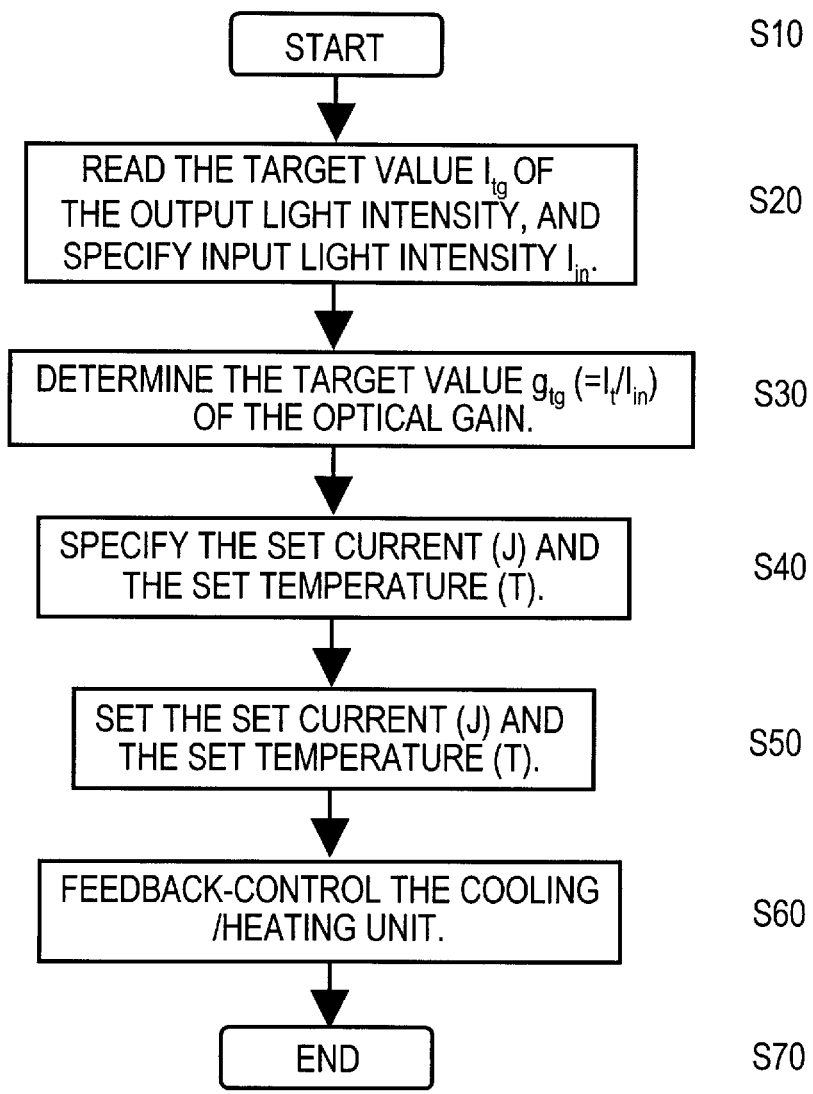
FIG. 9 is a flowchart illustrating the control procedure of the semiconductor optical amplifier in the optical amplification control apparatus, according to Embodiment 1.

FIG. 9 is a flowchart illustrating the control procedure of the semiconductor optical amplifier in the optical amplification control apparatus 32, according to the present embodiment.

First, by receiving an external control signal 38 which instructs to start operation, the optical gain control unit 34 initiates the optical amplification control apparatus 32 (step S10).

By the present step and the following step S20, the above-mentioned step S1 to specify the target value ($g_{tg}$) of the optical gain is achieved (step S20).

Next, the optical gain control unit 34 reads the target value ($I_{tg}$) of the output light intensity intended to be output from the SOA 2, and further, specifies the light intensity ($I_{in}$) of the input light (light to be amplified) incident to the SOA 2 (step S20).

The target value ($I_{tg}$) of the output light intensity is presented to the optical amplification control apparatus 32 by the external control signal 38. The target value ($I_{tg}$) of the output light intensity is 9 dBm, as an example. The reason that such high target light intensity is settable will be described later in "(3) Principle".

At this time, to the present optical amplification control apparatus 32, the input light 12 (optical signal having a mark ratio of 50%, for example) is led by an optical fiber (not depicted), so as to be input into the input terminal 14. The input light 12 is led to the optical splitter 20 on the input side, so as to be split thereby. One of the split input light is led to the photodetector 24 on the input side, while the other is led to the SOA 2. Here, most portion of the input light is split to the SOA 2 side, and becomes the input light (light to be amplified) of the SOA 2.

The amplified light led to the photodetector 24 on the input side is photoelectrically converted by the photodetector 24 on the input side. The photodetector 24 on the input side transmits the time average value of photoelectrically converted signals to the optical gain control unit 34.

Based on the signal received from the photodetector 24 on the input side, the optical gain control unit 34 specifies the light intensity ($I_{in}$) of the input light (light to be amplified) incident to the SOA 2.

The light intensity ($I_{in}$) of the input light (light to be amplified) incident to the SOA 2 is −2 dBm, for example.

Next, as the target value ($g_{tg}$) of the optical gain intended to be produced by the SOA 2, the optical gain control unit 34 determines a ratio ($I_{tg}/I_{in}$) of the target value ($I_{tg}$) of the output light intensity relative to the light intensity ($I_{in}$) of the input light (light to be amplified) incident to the SOA 2.

For example, the optical gain control unit 34 determines the target value ($g_{tg}$) of the optical gain to be 11 dB (=9 dBm−(−2 dBm)).

Next, by referring to the lookup table 35, the optical gain control unit 34 specifies a drive current (set current) to be supplied to the SOA 2 and a temperature (set temperature) at which the SOA 2 is to be retained, corresponding to the above target value ($g_{tg}$=11 dB) of the optical gain (step S40).

As an example, the drive current (J) is 300 mA, and the set temperature (T) is 40° C.

Here, when the target value ($g_{tg}$) of the optical gain is not coincident with any target optical gains recorded in the lookup table 35, a drive current (J) and a set temperature (T) corresponding to a target optical gain nearest to the target value ($g_{tg}$) of the optical gain are selected.

Next, the optical gain control unit 34 supplies the above specified set current (300 mA) to the SOA 2, and set the temperature of the SOA 2 to the specified set temperature (40° C.) (step S50).

More specifically, the optical gain control unit 34 issues a current supply instruction to the SOA drive unit 28. According to this instruction, the SOA drive unit 28 supplies the drive current of 300 mA to the SOA 2. The supply of the above drive current (300 mA) is continued during step S60 described later.

Also, the optical gain control unit 34 issues a temperature set instruction to the temperature control unit 10. According to this instruction, the temperature control unit 10 controls the cooling/heating unit 36 (thermoelectric cooling device) so that the temperature of the SOA 2 becomes the set temperature (40° C.). Here, by detecting the output of the temperature sensor 8, the temperature control unit 10 feedback-controls the operation of thermoelectric cooling device 6, using the above sensed signal as a feedback signal.

As described earlier, the temperature detected by the temperature sensor 8 may be regarded as the temperature of the SOA 2.

By the present step, the intensity of the output light (amplified light) output from the SOA 2 is amplified to a value near the target value ($I_{tg}$=9 dBm) of the output light intensity.

Next, while keeping the drive current (J) supplied to the SOA 2 fixed, the optical gain control unit 34 feedback-controls the operation of the cooling/heating unit 36 so that the intensity ($I_{out}$) of the output light (amplified light) output from the SOA 2 becomes coincident with the target value ($I_{tg}$=9 dBm) of the output light intensity. At this time, the above intensity ($I_{out}$) is the feedback signal (step S60).

The detail of the feedback operation in the present step is as follows.

The output light (amplified light) output from the SOA 2 of which operation is started by step S40 is split to two directions by the optical splitter 22 on the output side.

One of the split amplified light is led to the photodetector 26 on the output side, while the other is led to the output terminal 18. Here, most portion of the amplified light is led to the output terminal 18, and becomes the output light 16.

The amplified light led to the photodetector 26 on the output side is photoelectrically converted by the photodetector 26 on the output side. The photodetector 26 on the output side transmits the time average value of the photoelectrically converted signals to the optical gain control unit 34.

Based on the signal received from the photodetector 26 on the output side, the optical gain control unit 34 specifies the light intensity ($I_{out}$) of the output light (amplified light) being output from the SOA 2.

The optical gain control unit 34 compares the target value ($I_{tg}$=9 dBm) of the output light intensity with the specified light intensity ($I_{out}$) of the output light.

If the light intensity ($I_{out}$) of the output light is smaller than the above target value ($I_{tg}$=9 dBm) of the output light intensity, the optical gain control unit 34 issues an instruction to the temperature control unit 10 to decrease the temperature of the SOA 2.

As the temperature of the SOA 2 (SOA device temperature) decreases, the optical gain of the SOA 2 increases (refer to FIG. 7). As a result, the light intensity ($I_{out}$) of the output light increases, and approaches the target value ($I_{tg}$).

On the other hand, if the light intensity ($I_{out}$) of the output light is larger than the target value ($I_{tg}$=9 dBm) of the output light intensity, the optical gain control unit 34 issues an instruction to the temperature control unit 10 to increase the temperature of the SOA 2.

As the temperature of the SOA 2 (SOA device temperature) rises, the optical gain of the SOA 2 decreases (refer to FIG. 7). As a result, the light intensity ($I_{out}$) of the output light decreases, and approaches the target value ($I_{tg}$).

Until receiving an operation stop instruction, the optical gain control unit 34 repeats the above adjustment operation of the optical gain (refer to step 70 below).

As a result, the light intensity ($I_{out}$) of the output light (amplified light) of the SOA 2 gradually approaches the target value ($I_{tg}$) of the output light intensity, and finally, becomes substantially coincident with the target value ($I_{tg}$) of the output light intensity.

Further, according to the present step, the intensity of the output light 16 of the optical amplification control apparatus 32 is maintained to a constant value, even when the intensity of the input light 12 incident to the optical amplification control apparatus 32 varies.

On receipt of the external control signal 38 which instructs to stop the operation, the optical gain control unit 34 stops the operation of the optical amplification control apparatus 32 (step S70).

As is apparent from the above procedure, according to the present optical amplification control apparatus 32, the light intensity of the amplified light is controlled not only by the drive current but by the device temperature. According to the present control method, as described in the following "(3) Principle", it becomes unnecessary to excessively suppress the intensity of the amplified light of the SOA 2 to suppress the pattern effect, and it becomes possible to increase the intensity of the amplified light.

(3) Principle

Next, description will be given on the principle of the present optical amplification control apparatus 32, capable of increasing the output light (amplified light) of the SOA 2 while avoiding the pattern effect.

FIG. 10 is a diagram illustrating the variation of the saturation optical output power of the SOA 2, relative to the device temperature. The saturation optical output power characteristic depicted in FIG. 10 was measured under identical conditions to the conditions applied when the SOA amplification characteristics depicted in FIG. 3 and FIG. 7 were measured, except for points that the drive current is 300 mA and the device temperature is 25 to 60° C.

Hereafter, the aforementioned principle will be described by reference to FIG. 7 and FIG. 10.

Now, similar to the SOA described in the aforementioned "drive-current controlled optical amplification control apparatus", it is assumed that the optical gain of the SOA according to the present embodiment also varies between 8.0 dB and 12.5 dB.

The temperature of the SOA 2 when being operated at the optical gain 12.5 dB is 25° C. (refer to FIG. 7). The saturation optical output power of the SOA 2 at this time is 15.2 dBm (refer to FIG. 10). On the other hand, the temperature of the SOA 2 when being operated at the optical gain 8.0 dB is 60° C. (refer to FIG. 7). The saturation optical output power of the SOA 2 at this time is 14.0 dBm (refer to FIG. 10).

Namely, in the present optical amplification control apparatus 32, the saturation optical output power thereof varies only between 14.0 dBm and 15.2 dBm, even when the optical gain of the SOA 2 varies between 8.0 dB and 12.5 dB.

Therefore, in the present optical amplification control apparatus 32, the target value ($I_{tg}$) of the output light intensity of the amplified light may be set to a value as high as 9.0 dBm (14.0 dBm–5.0 dB) (here, it is assumed that the pattern effect may be suppressed sufficiently, when the amplified light intensity is 5.0 dB or beyond lower than the saturation optical output power).

The above value is 4 dB higher than the target value 5 dBm of the output light intensity of the drive-current controlled optical amplification control apparatus 4 (refer to "optical gain adjustment by drive current" described earlier).

A reason why such a high target value of the output light intensity is settable is that, despite that the SOA optical gain gradually decreases as the device temperature increases (refer to FIG. 7), the saturation optical output power hardly decreases even when the device temperature increases (refer to FIG. 10).

As such, according to the present optical amplification control apparatus 32, it is possible to suppress the pattern effect even if the intensity of the output light (amplified light) of the SOA 2 is increased.

Now, according to the present optical amplification control apparatus 32, the optical gain may be varied by the adjustment of the temperature of the SOA 2. Accordingly, an overshoot of the gain does not occur due to an abrupt variation of the carrier density as in the drive current controlled optical amplification control apparatus in which the optical gain varies in the order of several ns.

Finally, a reason that the SOA saturation optical output power is insensitive to the variation of the device temperature will be described.

The SOA saturation optical output power Ps is expressed by the following equation.

[Equation 1]

$$P_s = \frac{h}{2\pi}\omega \frac{dW}{\Gamma} \frac{1}{\tau_s} \frac{1}{\frac{dg}{dN}} \quad (1)$$

Here, h is the Planck constant. ω is the optical angular frequency. d is the thickness of the active layer. W is the width of the SOA active layer. Γ is the optical confinement factor of the SOA active layer. $\tau_s$ is the carrier lifetime in the active layer. dg/dN is the differential gain factor. g is the optical gain of the active layer. N is the carrier density of the active layer.

When the SOA temperature is increased while the injection current is maintained constant, the carrier overflows from the active layer. As a result, the carrier density decreases, and $\tau_s$ increases. According to equation (1), an increase of $\tau_s$ produces a decreased saturation optical output power Ps.

However, an SOA temperature rise also produces a decreased differential gain factor dg/dN. Accordingly, even if the carrier density decreases due to the SOA temperature rise, the decrease of the saturation optical output power $P_s$ is small.

Meanwhile, because the optical gain is nearly proportional to the carrier density, the optical gain gradually decreases when $\tau_s$ decreases due to the temperature rise (the carrier density is a product between $\tau_s$ and the drive current).

Accordingly, as depicted in FIGS. 7 and 10, when the SOA temperature increases, the saturation optical output power hardly decreases, though the optical gain gradually decreases.

The above-mentioned is the reason that the SOA saturation optical output power is insensitive to the variation of the device temperature.

Now, it is known that the SOA optical gain having the active layer composed of quantum dots is almost independent of the device temperature. However, the above characteristic is in a specific wavelength range and a specific temperature range. Except for the above wavelength range and the temperature range, the optical gain of the SOA having the active layer composed of quantum dots gradually decreases when the device temperature increases. Therefore, in a wavelength range and a temperature range except for the above wavelength range and the temperature range, the control of the SOA 2 to be executed in the present optical amplification control apparatus is effective even when the active layer of the SOA 2 is an active layer composed of quantum dots (which is also applicable in the following Embodiments).

(Embodiment 2)

The present embodiment relates to an optical amplification control apparatus (optical amplifier module) supplying a different drive current (J) to the SOA according to the target value ($g_{tg}$) of the optical gain, not only cooling or heating of the SOA. Here, the present optical amplification control apparatus executes APC control.

(1) Configuration

The configuration of an optical amplification control apparatus 40 is approximately identical to the configuration of the optical amplification control apparatus 32 according to Embodiment 1, except for the points of second control, which is executed in an optical gain control unit 42, and an advanced lookup table.

Therefore, description related to portions common to the optical amplification control apparatus 32 according to Embodiment 1 will be omitted, and only different portions from the optical amplification control apparatus 32 according to Embodiment 1 will be described. Here, the configuration diagram of the optical amplification control apparatus 40 according to the present embodiment is identical to FIG. 5 which is referred to in Embodiment 1.

(i) Point of Difference from Embodiment 1

The second control for the present optical gain control unit 42 is advanced from the second control executed by the optical gain control unit 34 according to Embodiment 1.

Figure 13:
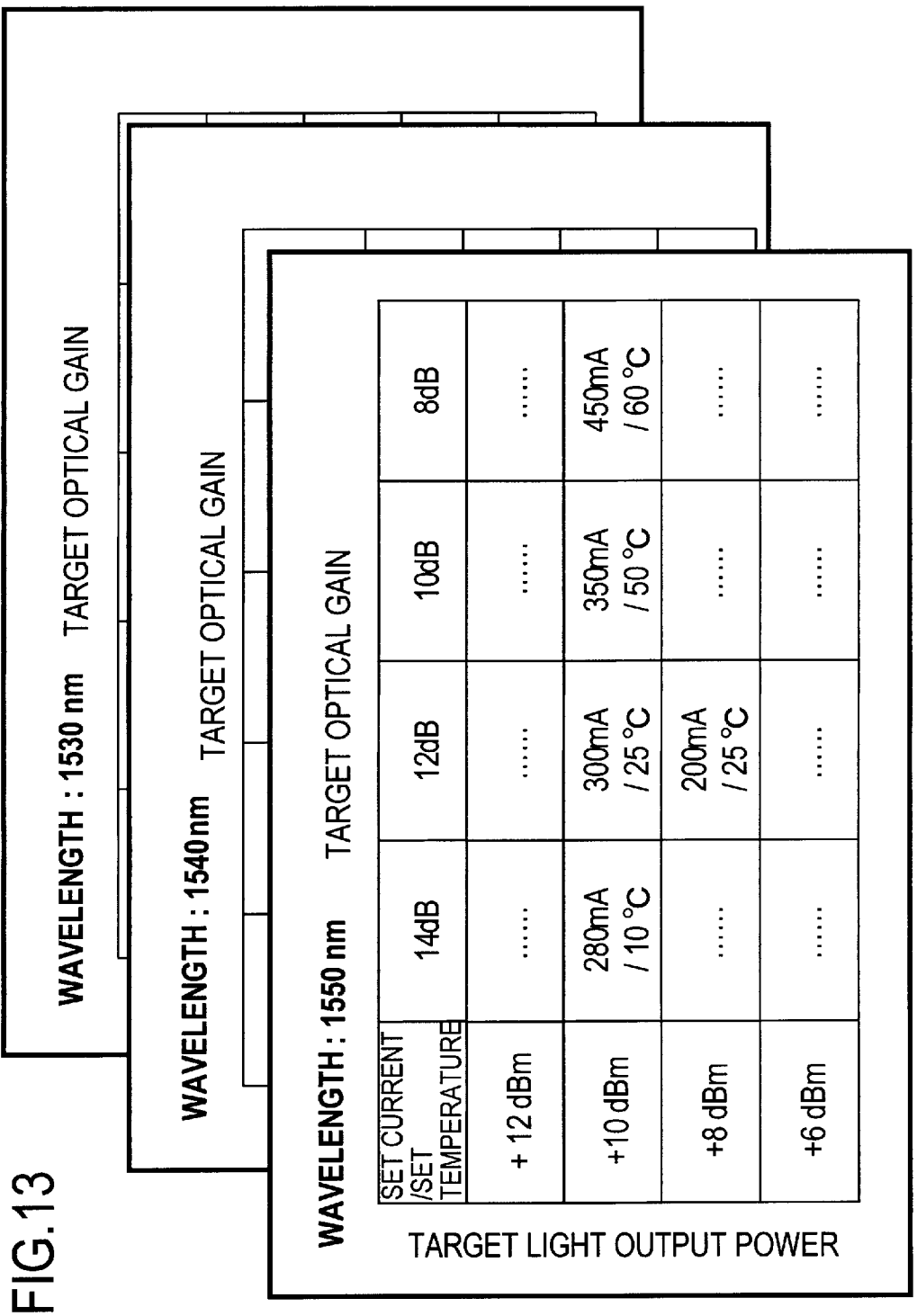
FIG. 13 is one example of a lookup table recorded in the optical gain control unit according to Embodiment 2.

FIG. 13 is one example of a lookup table 44 to which the present optical gain control unit 42 refers to execute the second control.

More specifically, the second control of the present optical gain control unit 42 is control as described below.

The lookup table 44 has recorded combinations of the drive current of the SOA 2 and the operating point (temperature) of the cooling/heating unit 36 to make the optical gain of the SOA 2 coincide with any one of a plurality of optical gain to be targeted, and also to make the output light intensity of the SOA 2 coincide with any one of a plurality of the output light intensity to be targeted.

Here, each optical gain to be targeted is a target optical gain described in the first row of the lookup table 44. Also, the output light intensity to be targeted is target light output power described in the first column of the lookup table 44. Further, the combinations of the drive current of the SOA 2 and the operating point (temperature) of the cooling/heating unit 36 are the combinations of the set current and the set temperature recorded in the lookup table 44.

The above combinations are also combinations to maintain the difference between the saturation optical output power of the SOA 2 and the above output light intensity to be targeted (target light output power) to be constant.

The present optical gain control unit 42 drives the SOA 2 and at the same time, operates the cooling/heating unit by the combination of the set current and the set temperature by which the optical gain to be targeted (target optical gain) is the nearest to the target value ($g_{tg}$) of the optical gain and the output light intensity to be targeted (target light output power) is the nearest to the target value ($I_{tg}$) of the above output light intensity.

To explain briefly, in the second control of the present optical gain control unit 42, a different drive current (J) is supplied to the SOA according to the target value ($g_{tg}$) of the optical gain, not only cooling or heating the SOA 2.

Figure 11:
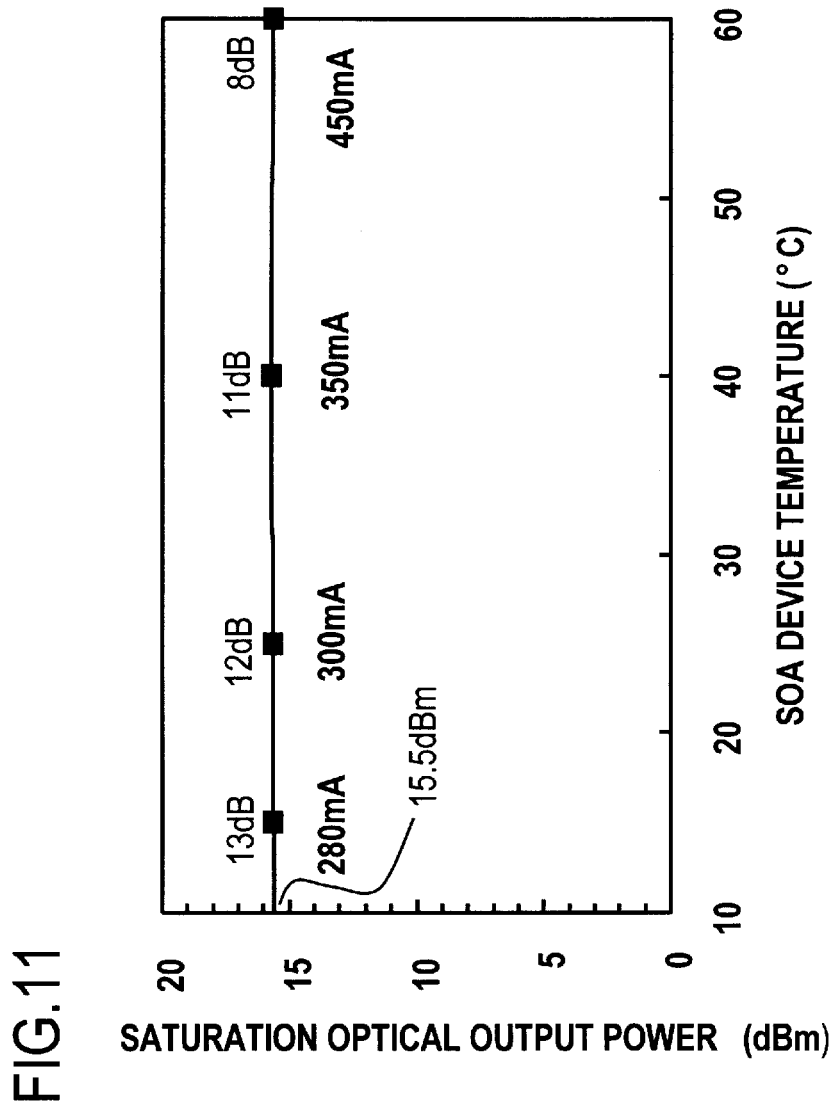
FIG. 11 is a diagram illustrating the device temperature dependency of the saturation optical output power, when the device temperature of the SOA 2 is varied while the drive current (J) is varied in such a manner that the saturation optical output power becomes a constant value (15.5 dBm).

FIG. 11 is a diagram illustrating the device temperature dependency of the saturation optical output power ($P_s$), when the device temperature (T) of the SOA 2 is varied while the drive current (J) is varied in such a manner that the saturation optical output power becomes a constant value, 16 dBm. The SOA used in measurement is identical to the SOA used in the measurement of FIG. 4 which is referred to in Embodiment 1. Also, measurement conditions are identical to the conditions used in the measurement of FIG. 4, except for a point that the drive current (J) is varied.

The horizontal axis in FIG. 11 is the device temperature (T) of the SOA, while the vertical axis is the saturation optical output power of the SOA. In FIG. 11, the drive current (J) supplied to the SOA and the optical gain generated in the SOA at that time are depicted for each device temperature.

As the optical amplification control apparatus 32 according to Embodiment 1, if only the device temperature (that is, the temperature T of the cooling/heating unit 36) is varied without varying the drive current (J) of the SOA, the saturation optical output power is also varied, though it is slight (refer to FIG. 10). However, as depicted in FIG. 11, when the drive current (J) is increased in synchronization with a rise of the device temperature, it is possible to maintain the SOA saturation optical output power constant.

Accordingly, irrespective of the optical gain to be targeted (target optical gain), it is possible to maintain the difference between the saturation optical output power (15.5 dBm, for example) of the SOA 2 and the output light intensity to be targeted (target light output power; 10 dBm, for example), (that is, 5.5 dB=15.5 dBm−10 dBm, for example) to be constant.

The lookup table 44 is based on such the SOA characteristic.

Figure 12:
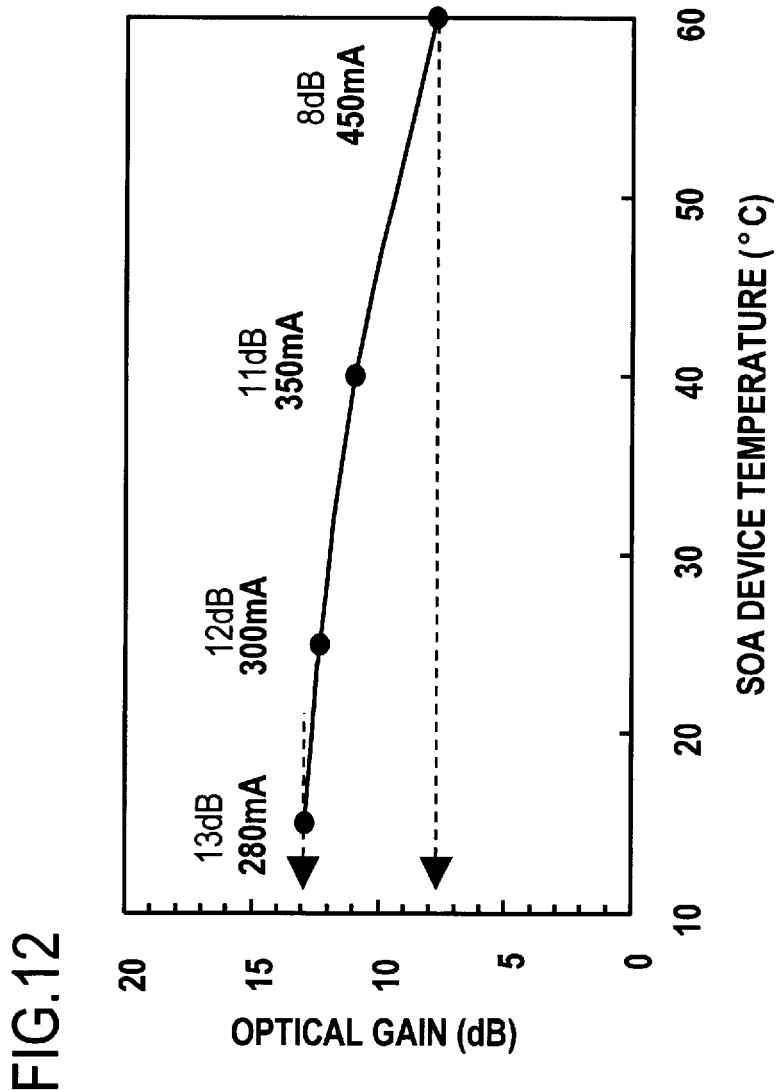
FIG. 12 is a diagram illustrating the device temperature dependency of the optical gain, when the device temperature of the SOA 2 is varied while the drive current (J) is varied in such a manner that the saturation optical output power becomes a constant value (15.5 dBm).

Additionally, in FIG. 12, there is depicted the variation of the optical gain when the device temperature (T) of the SOA 2 is varied while the drive current (J) is varied in such a manner that the saturation optical output power becomes a constant value, 15.5 dBm. The SOA used in the measurement is identical to the SOA used in the measurement of FIG. 3 (and FIG. 4). Also, measurement conditions are identical to the conditions used in the measurement of FIG. 3 and FIG. 4, except for a point that the drive current (J) is varied.

The horizontal axis in FIG. 12 is the device temperature (T) of the SOA, and the vertical axis is the optical gain of the SOA. In FIG. 12, the drive current (J) supplied to the SOA is depicted for each device temperature.

As depicted in FIG. 12, even if the drive current (J) is varied along with the device temperature (T), it is possible to vary the optical gain over a wide range (8 dB to 13 dB).

On the other hand, according to the control method of Embodiment 1 in which the drive current (J) of the SOA 2 is maintained constant, when the device temperature is raised from 25° C. to 60° C., the saturation optical output power decreases from 15.5 dBm to 14 dBm. Therefore, the target value ($I_{tg}$) of the output light intensity has to be 9 dBm (=14 dBm−5 dB) or lower.

On the other hand, as described above, according to the present embodiment, the target value ($I_{tg}$) of the output light intensity becomes 10 dBm (<15.5 dBm−5 dB).

In other words, according to the present embodiment, it is possible to make the target value ($I_{tg}$) of the output light intensity higher than in the optical amplification control apparatus 32 according to Embodiment 1, while avoiding the pattern effect.

(ii) Lookup Table

As described above, FIG. 13 is one example of the lookup table 44 recorded in the optical gain control unit 42.

In the lookup table 44, in order to operate the SOA 2 at the optical gain to be targeted (target optical gain) and the target value of the output light intensity (target light output power), the combinations of the drive current (set current) to be supplied to the SOA 2 and the temperature (set temperature) at which the SOA 2 is to be retained are recorded.

Also, the lookup table 44 according to the present embodiment is prepared for a plurality of wavelengths (1,550 nm, 1,540 nm and 1,530 nm) so as to be able to deal with even if the wavelength of the incident light (light to be amplified) to the SOA 2 is varied.

(2) Operation

Next, the operation of the optical amplification control apparatus 40 will be described according to the control method of the SOA 2 executed in the optical amplification control apparatus 40.

First, a main portion of the operation of the optical amplification control apparatus 40 will be described.

The main portion of the operation of the present optical amplification control apparatus 46 may be divided into three steps (steps S1-S3). Step S1 to step S3 are operation executed by the optical gain control unit 48 according to the above-mentioned first to third control, respectively (for example, step S1 corresponds to the control 1). Such the operation has already been described in the above "(1) Configuration". Therefore, the description of steps S1-S3 for describing the main portion of the operation of the present optical amplification control apparatus 46 will be omitted.

Next, detailed operation of the optical amplification control apparatus 40 will be described.

The SOA control procedure executed in the present optical amplification control apparatus 40 includes reading the wavelength of the input light (light to be amplified) incident to the SOA also from external, not only the target value ($I_{tg}$) of the output light intensity of the amplified light, in step S20 of Embodiment 1 having been described by reference to FIG. 9.

Further, the present control procedure is different from the control procedure of the optical amplification control apparatus 32 according to Embodiment 1, in the point that, in step S40 of Embodiment 1, the set current (J) and the set temperature (T) are specified by reference to the lookup table 44 having been described by reference to FIG. 13, instead of FIG. 6.

Figure 14:
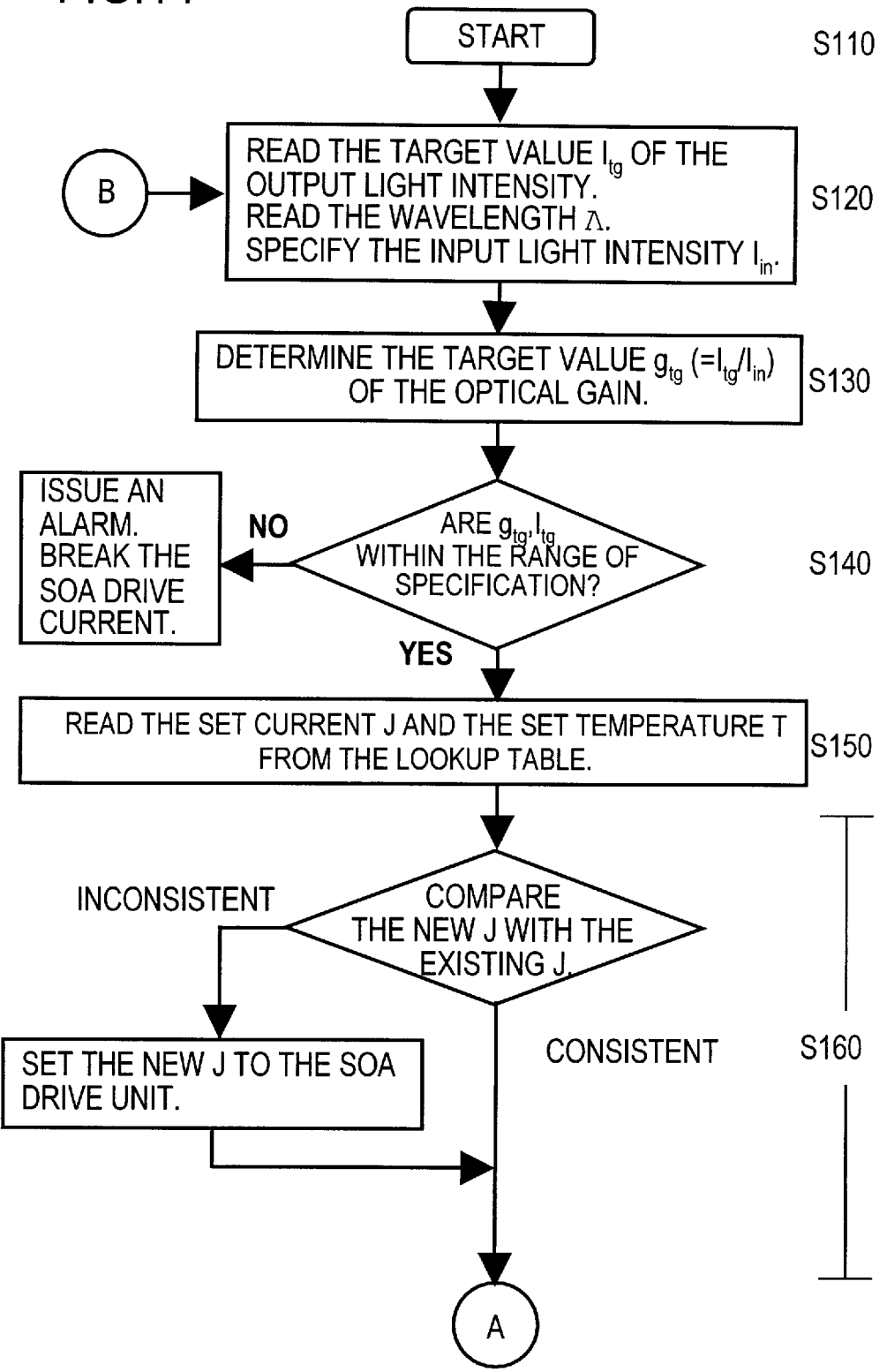
FIG. 14 is a flowchart illustrating the control procedure of the semiconductor optical amplifier in the optical amplification control apparatus, according to Embodiment 2 (part 1).
Figure 15:
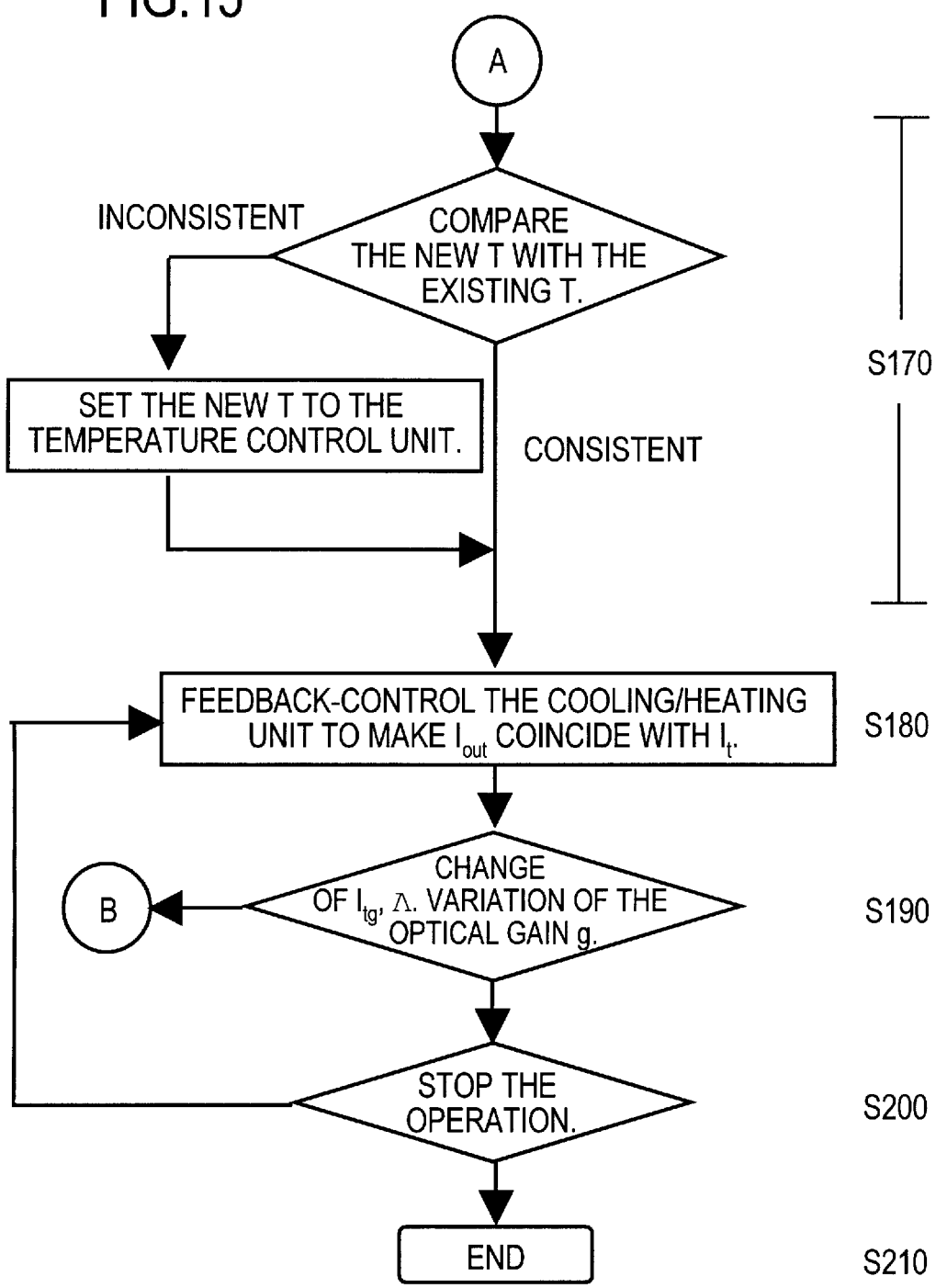
FIG. 15 is a flowchart illustrating the control procedure of the semiconductor optical amplifier in the optical amplification control apparatus, according to Embodiment 2 (part 2).

FIG. 14 and FIG. 15 are flowcharts illustrating the control procedure of the semiconductor optical amplifier in the optical amplification control apparatus 40 according to the present embodiment. Here, in regard to portions common to the control procedure described in Embodiment 1 by reference to FIG. 9, the description will be omitted.

(i) Step S110

The present step for initiating the optical amplification control apparatus 40 is identical to step S10 described in Embodiment 1.

(ii) Step S120

The present step corresponds to step S20 described in Embodiment 1.

In the present step, the optical gain control unit 42 reads in the target value ($I_{tg}$) of the output light intensity (amplified light) and the wavelength λ of the input light (light to be amplified) incident to the SOA for the output light of the SOA2, and further, specifies the light intensity ($I_{in}$) of the input light (light to be amplified) incident to the SOA 2.

The wavelength of the input light (light to be amplified) incident to the SOA 2 is reported to the optical amplification control apparatus 32 by the external control signal 38, as well as the target value ($I_{tg}$) of the output light intensity.

(iii) Step S130

The present step is an identical step to step S30 described in Embodiment 1 (refer to FIG. 9).

(iv) Step S140

In the present step, it is decided whether or not the target value ($I_{tg}$) of the output light intensity of the output light and the target value ($g_{tg}$) of the optical gain are existent within assumed ranges (for example, the operable ranges of the SOA).

More specifically, it is decided whether or not the target value ($I_{tg}$) of the output light intensity and the target value ($g_{tg}$) of the optical gain for the output light are existent within the ranges of the target light output power and the target optical gain (6 dBm to 12 dBm; 8 dB to 14 dB).

When the target value ($I_{tg}$) of the output light intensity and the target value ($g_{tg}$) of the optical gain for the output light are not existent within the specification ranges, the optical gain control unit 42 issues an alarm, and intercepts the drive current to be supplied to the SOA 2.

(v) Step S150

The present step corresponds to step S40 described in Embodiment 1.

In the present step, by referring to the lookup table 44, the optical gain control unit 42 specifies the drive current (J) (set current) to be supplied to the SOA 2 and the temperature T (set temperature) at which the SOA 2 is to be retained, corresponding to the wavelength (λ) of the input light and the target value of the optical gain. In short, the optical gain control unit 42 reads out the set current (J) and the set temperature (T) from the lookup table 44.

The wavelength (λ) of the input light and the target value ($g_{tg}$) of the optical gain are, for example, 1,550 nm and 12 dB. Also, the set current (J) and the set temperature (T) are, for example, 300 mA and 25° C.

(vi) Step S160

The present step and a step executed in step 170 described below correspond to step S50 described in Embodiment 1 (refer to FIG. 9).

The present step and step S170 described below are procedures which may cope with even when the target value ($I_{tg}$) of the output light intensity of the amplified light etc. are changed during the operation of the optical amplification control apparatus 40.

In the present step, the optical gain control unit 42 compares the drive current J (set current; 300 mA, for example) to be supplied to the SOA 2, which is specified in step S150, with a drive current $J_p$ (280 mA, for example) having been supplied to the SOA 2 before the execution of the present step.

As the result of comparison, if both are coincident with each other, the optical gain control unit 42 maintains the drive current (280 mA, for example) supplied to the SOA 2.

On the other hand, if both are not coincident, the optical gain control unit 42 supplies to the SOA 2 the drive current J (300 mA, for example) to be supplied to the SOA 2, which is specified in step S150.

Here, the set current immediately after the optical amplification control apparatus 40 is initiated is 0 mA. Therefore, when the present step S160 is executed first, $J_p=0$ mA.

(vii) Step S170

In the present step, the optical gain control unit 42 compares the temperature T (set temperature), specified in step S150, at which the SOA 2 is to be retained, with a temperature $T_p$ (10° C., for example) at which the SOA 2 has been retained before the execution of the present step.

As the result of comparison, if both are coincident with each other, the optical gain control unit 42 maintains the temperature (10° C., for example) at which the SOA 2 is retained.

On the other hand, if both are not coincident, the optical gain control unit 42 retains the SOA 2 at the temperature T (25° C., for example), specified in step S150, at which the SOA 2 is to be retained.

Here, the set temperature immediately after the optical amplification control apparatus 40 is initiated is 25° C. Therefore, when the present step S170 is executed first, $T_p=25°$ C.

(viii) Step S180

The present step S180 is substantially identical to step S60 described in Embodiment 1 (refer to FIG. 9).

Here, the present step is completed after the operation of adjusting the temperature of the cooling/heating unit 36 (that is, the temperature T of the SOA 2) is repeated for a predetermined number of times (100 times, for example), using the output light intensity ($I_{out}$) of the SOA 2 as a feedback signal.

Thereafter, the following step S190 is started.

(ix) Step S190

The present step is a procedure to deal with a case when the target value ($I_{tg}$) of the output light intensity of the amplified light is changed, or the like, during the operation of the optical amplification control apparatus 40.

In the present step, the optical gain control unit 42 refers to the external control signal 38 and confirms whether the target value ($I_{tg}$) of the output light intensity of the amplified light and the wavelength λ of the input light (light to be amplified) incident to the SOA, which are read in step S120, have not been changed.

Also, from the ratio of the light intensity ($I_{out}$) of the output light (amplified light) output from the SOA 2 relative to the light intensity ($I_{in}$) of the input light (light to be amplified) incident to the SOA 2, the optical gain control unit 42 specifies the optical gain of the SOA 2 presently in operation, and confirms whether the difference between the target value $g_{tg}$ of the optical gain specified in step S130 and the above ratio ($=I_{out}/I_{in}$) reaches a predetermined value, for example 1 dB (½ of the gap of the target optical gain), or higher.

As the result of confirmation, if any one of cases is satisfied among a case that the target value ($I_{tg}$) of the output light intensity has been changed, a case that the wavelength λ of the input light (light to be amplified) incident to the SOA has been changed, and a case that the difference between the actual optical gain of the SOA 2 in operation and the target value $g_{tg}$ of the optical gain extends to, for example, 1 dB or more, a new procedure is restarted after return to the above-mentioned step S120.

Accordingly, even when the target value ($I_{tg}$) of the output light intensity or the wavelength λ of the input light (light to be amplified) is changed during the operation of the optical amplification control apparatus 40, the optical amplification control apparatus 40 may cope with the changed operational condition.

Further, when the difference between the optical gain (g) of the SOA 2 and the target value ($g_{tg}$) of the optical gain extends to, for example, 1 dB or greater, a new drive current (J) and a temperature (T) at which the SOA 2 is to be retained are specified, and the operation of the SOA 2 is controlled by the newly specified drive current (J) and the temperature (T).

Therefore, it does not happen that the pattern effect is produced because the difference between the saturation optical output power of the SOA 2 and the output ($I_{out}$) of the SOA 2 becomes smaller during the execution of step S180 (feedback control). Additionally, even if the optical gain varies 1 dB or of that order, the saturation optical output power of the SOA hardly varies (refer to FIG. 7 and FIG. 10).

(x) Step S200

In the present step, the optical gain control unit 42 confirms whether an operation stop instruction is issued to the optical amplification control apparatus 40, by referring to the external control signal 38.

If the operation stop instruction is issued, the process proceeds to step S210.

If the operation stop instruction is not issued, the process returns to step S180.

(xi) Step S210

In the present step, the optical gain control unit 42 stops the operation of the optical amplification control apparatus 40.

As described above, in the optical amplification control apparatus 40 according to the present embodiment, the operation of the SOA 2 is controlled based on the combination of the set current and the set temperature to retain the difference between the output light intensity ($I_{out}$) and the saturation optical output power constant, even when the target optical gain differs. Accordingly, the optical amplification control apparatus 40 may increase the light intensity of the output light (amplified light) of the SOA 2 greater than the optical amplification control apparatus 32 according to Embodiment 1.

(Embodiment 3)

The present embodiment relates to an optical amplification control apparatus (optical amplifier module) for controlling the operation of a semiconductor optical amplifier to produce a constant optical gain of the SOA by cooling or heating the SOA. Namely, the present optical amplification control apparatus executes AGC control.

(1) Configuration

The configuration of the optical amplification control apparatus according to the present embodiment is basically identical to the configuration of the optical amplification control apparatus 32 according to Embodiment 1. However, in the control executed by an optical gain control unit 48, there is a point of difference from the control of the optical amplification control apparatus 32 according to Embodiment 1.

First, the control executed by the optical gain control unit 48, which is the point of difference from the optical amplification control apparatus 32, will be described. Next, a lookup table 50 provided in an optical amplification control apparatus 46 will be described in brief. Description on the other configurations is omitted. Here, the configuration diagram of the optical amplification control apparatus 46 according to the present embodiment is identical to the configuration diagram (FIG. 5) of the optical amplification control apparatus 32 according to Embodiment 1.

The optical gain control unit 48 executes first control to specify the target value ($g_{tg}$) of the optical gain intended to be generated in SOA 2.

More specifically, the optical gain control unit 48 determines the target value of the optical gain reported by the external control signal 38, as a target value ($g_{tg}$) of the optical gain which is one of parameters to control the SOA 2.

The target value ($g_{tg}$) of the optical gain is 12 dB, for example.

Next, by controlling the operation of the cooling/heating unit 36, the optical gain control unit 48 executes second control which varies the optical gain of the SOA 2 so that the optical gain of the SOA 2 becomes coincident with the above target value ($g_{tg}$) of the optical gain.

More specifically, the optical gain control unit 48 operates the SOA 2 and the cooling/heating unit 36 with the combination of the drive current (J) of the SOA 2 and the operating point of the cooling/heating unit 36 by which the SOA 2 may be operated in a non-saturated output power state and the optical gain of the SOA 2 becomes coincident with the above gain target value ($g_{tg}$). Here, the operating point of the cooling/heating unit 36 signifies the temperature (T) of the cooling/heating unit 36.

Next, while keeping the drive current (J) of the SOA 2 fixed, the optical gain control unit 48 executes third control to feedback control the cooling/heating unit operation 36, using the operating state of the SOA 2 as a feedback signal.

More specifically, the optical gain control unit 48 feedback-controls the operation of the cooling/heating unit 8 so that a ratio ($=I_{out}/I_{in}$) of the output light intensity ($I_{out}$) output from the SOA 2 relative to the light intensity ($I_{in}$) of the input light incident to the SOA 2 becomes coincident with the target value ($g_{tg}$) of the optical gain, using the above ratio as the feedback signal. At this time, the drive current (J) is kept fixed.

The optical gain control unit 48 executes the above second control by referring to the lookup table 50. The lookup table 50 is identical to, for example, the lookup table 35 described in Embodiment 1 by reference to FIG. 6. The lookup table 50 is recorded, for example, in a recording medium (not depicted) provided in the optical gain control unit 48.

(2) Operation

Next, the operation of the optical amplification control apparatus 46 will be described according to the control method of the SOA 2 executed in the optical amplification control apparatus 46.

First, a main portion of the operation of the present optical amplification control apparatus 46 is described.

The main portion of the operation of the present optical amplification control apparatus 46 may be divided into three steps (steps S1-S3). Step S1 to step S3 are operation executed by the optical gain control unit 48, according to the above-mentioned first to the third control, respectively (for example, step S1 corresponds to the control 1). Such the operation has already been described in the above "(1) Configuration". Therefore, the description of step S1-S3 describing the main portion of the operation of the present optical amplification control apparatus 46 will be omitted.

Next, the detailed operation of the optical amplification control apparatus 46 will be described according to the control procedure of the SOA 2.

Figure 16:
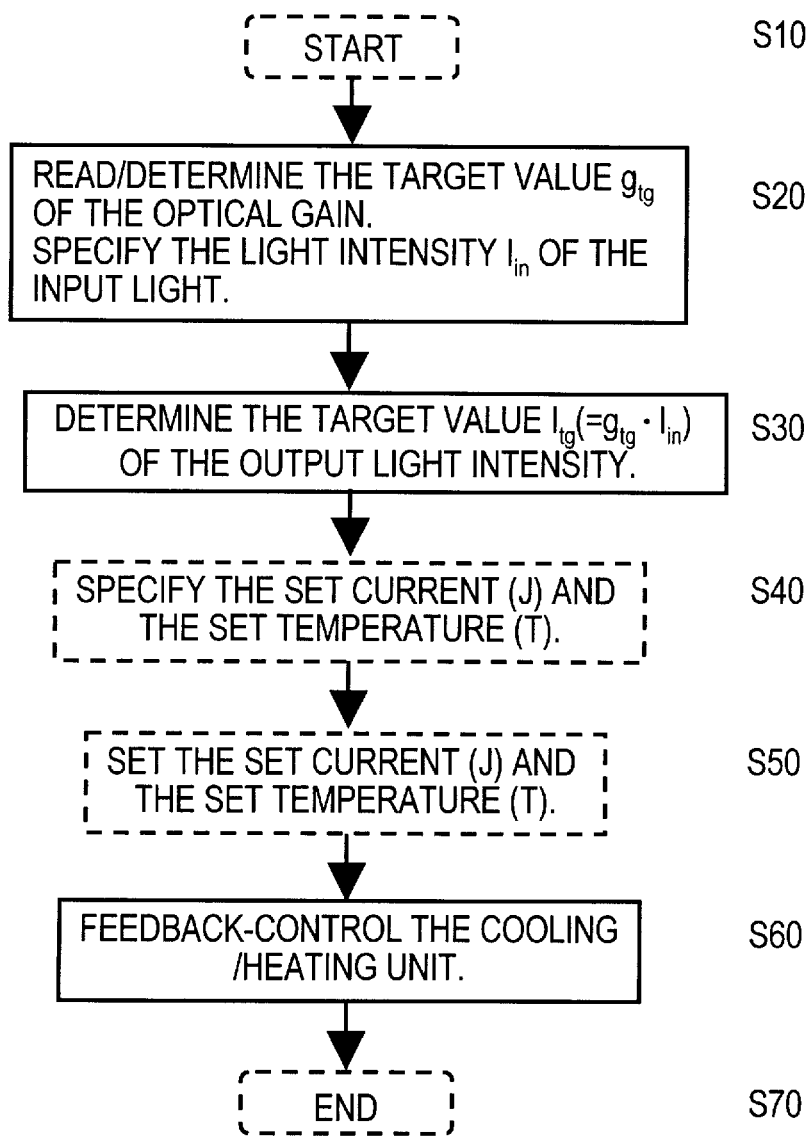
FIG. 16 is a flowchart illustrating the control procedure of the semiconductor optical amplifier in the optical amplification control apparatus, according to Embodiment 3.

FIG. 16 is a flowchart illustrating the control procedure of the SOA 2 in the optical amplification control apparatus 46, according to the present embodiment.

(i) Step S10

First, the optical gain control unit 48 receives the external control signal 38 instructing the start of operation, and initiates the optical amplification control apparatus 32.

(ii) Step S20

The above-mentioned step S1 is achieved by the present step and the following step S20.

First, the optical gain control unit 34 reads the target value of the optical gain of the SOA 2 and further, specifies the light intensity ($I_{in}$) of the input light (light to be amplified) incident to the SOA 2.

The target value ($g_{tg}$) of the optical gain is reported to the optical amplification control apparatus 46 as the external control signal 38.

The optical gain control unit 48 determines the read target value of the optical gain as the target value ($g_{tg}$) of the optical gain, which is one of parameters to control the SOA 2.

The target value ($g_{tg}$) of the optical gain is 12 dB, for example. The light intensity ($I_{in}$) of the input light (light to be amplified) is −4 dBm, for example.

(iii) Step S30

In the present step, the optical gain control unit 48 determines a product of the target value ($g_{tg}$) of the optical gain and the light intensity ($I_{in}$) of the input light (light to be amplified) to be the target value ($I_{tg}$) of the output light intensity of the SOA 2.

For example, the optical gain control unit 48 specifies the target value ($I_{tg}$) of the light output power to be 8 dBm ($=10 \cdot \log((g_{tg} \cdot I_{in})/1\ \text{mW})) = 10 \cdot \log(g_{tg}) + 10 \cdot \log(I_{in}/1\ \text{mW}) = 12\ \text{dB} - 4\ \text{dBm}$).

(iv) Step S40

The above-mentioned step S2 is achieved by the present step and the following step S50.

In the present step, by reference to lookup table (refer to FIG. 6), the optical gain control unit 48 specifies the drive current (set current) to be supplied to the SOA 2 and the temperature (set temperature) at which the SOA 2 is to be retained, corresponding to the above target value ($g_{tg}$=12 dB) of the optical gain.

For example, the drive current (J) is 300 mA, and the set temperature (T) is 25° C.

(v) step S50

The present step is identical to step S40 executed in the optical gain control unit 32 in Embodiment 1 described by reference to FIG. 9.

In the present step, the optical gain control unit 48 supplies to the SOA 2 the drive current (J=300 mA) to be supplied to, and sets the temperature of the SOA 2 to the temperature to be retained at (T=25° C.).

By the present step, the optical gain of the SOA 2 becomes a value near the target value ($g_{tg}$=12 dB) of the optical gain.

The step is identical to step S50 executed in the optical gain control unit 32 according to Embodiment 1 described by reference to FIG. 9.

(vi) Step S60

The above-mentioned step S3 is achieved by the present step.

In the present step, the optical gain control unit 48 receives the outputs of the photodetector 24 on the input side and the photodetector 26 on the output side, and specifies the light intensity ($I_{in}$) of the input light (light to be amplified) incident to the SOA 2 and the intensity ($I_{out}$) of the output light (amplified light) output from the SOA 2.

Next, the optical gain control unit 48 feedback-controls the operation of the cooling/heating unit 8 so that the ratio of the above $I_{out}$ to $I_{in}$ (=$I_{out}/I_{in}$) becomes coincident with the target value (12 dB) of the optical gain, using the above ratio as a feedback signal. Here, the ratio of $I_{out}$ to $I_{in}$ is the optical gain of the SOA presently in operation.

More specifically, if the ratio of $I_{out}$ to $I_{in}$ (=$I_{out}/I_{in}$) is smaller than the target value ($g_{tg}$) of the optical gain, the optical gain control unit 48 decreases the temperature of the cooling/heating unit 8. On the other hand, if the ratio of $I_{out}$ to $I_{in}$ (=$I_{out}/I_{in}$) is greater than the target value ($g_{tg}$) of the optical gain, the optical gain control unit 48 increases the temperature of the cooling/heating unit 8.

By the repetition of the above feedback control, the optical gain (g=$I_{out}/I_{in}$) of the SOA 2 gradually approaches the target value ($g_{tg}$) of the optical gain, and finally, becomes substantially coincident with the target value ($g_{tg}$) of the optical gain.

Now, in a state that the above feedback control converges and the optical gain becomes substantially coincident with the target value ($g_{tg}$) of the optical gain, intrinsically, the optical gain of the SOA 2 is not to be varied even if the state of the input light 12 (light intensity etc.) varies.

However, in case that the optical gain of the SOA 2 is dependent on the polarization direction of the input light (light to be amplified), the optical gain of the SOA 2 varies by the variation of the polarization direction of the input light.

In such a case, the optical gain of the SOA 2 is maintained constant by the above feedback control.

(vii) Step S70

On receiving the external control signal 38 which instructs to stop the operation, the optical gain control unit 48 stops the operation of the optical amplification control apparatus 46.

When the optical gain control unit is composed of an SOA having the characteristics depicted in FIGS. 3 and 4, the pattern effect does not occur even if the output light intensity ($I_{out}$) of the SOA 2 is amplified to 9 dBm (=14 dBm−5 dB), according to the present embodiment. However, to suppress the pattern effect, it is considered sufficient if the intensity of the output light (amplified light) is 5 dB smaller than the saturation optical output power.

On the other hand, in the drive current controlled optical amplification control apparatus 4, which is described by reference to FIG. 1, the pattern effect undesirably occurs if the output light intensity ($I_{out}$) becomes greater than 5 dBm (=10 dBm−5 dB).

As such, according to the present embodiment, it is possible to increase the output light intensity ($I_{out}$) while suppressing the pattern effect even when the AGC control is performed on the SOA.

(Embodiment 4)

The present embodiment relates to an optical amplification control apparatus (optical amplifier module) for controlling the operation of a semiconductor optical amplifier to produce a constant optical gain (AGC control) by supplying to the SOA a different drive current (J), according to the target value ($I_{tg}$) of the output light intensity of output light, not only by cooling or heating the SOA.

(1) Configuration

The configuration of an optical amplification control apparatus 52 is basically identical to the configuration of the optical amplification control apparatus 46 according to Embodiment 3. However, there are points different from the optical amplification control apparatus 46 according to Embodiment 3, in the control executed by an optical gain control unit 54, and the lookup table as well.

Accordingly, description will be given on the control executed by the optical gain control unit 54 and the lookup table, and description on other configurations will be omitted. Here, the configuration diagram of an optical amplification control apparatus 52 according to the present embodiment is identical to that depicted in FIG. 5 which is referred to in Embodiment 1.

The present optical gain control unit 54 includes the first to the third control provided in the optical gain control unit 48 according to Embodiment 3. However, new control is added to the first control. Also, the second control is advanced.

The control added to the first control is to determine a product of the target value ($g_{tg}$) of the optical gain and the light intensity ($I_{in}$) of the input light incident to the SOA 2 to be the target value ($I_{tg}$) of the output light intensity intended to be output from the SOA 2.

The second control is identical to the second control executed in the optical gain control unit 42 according to Embodiment 2. However, the lookup table to be used in the present control is different from the lookup table according to Embodiment 2.

Figure 17:
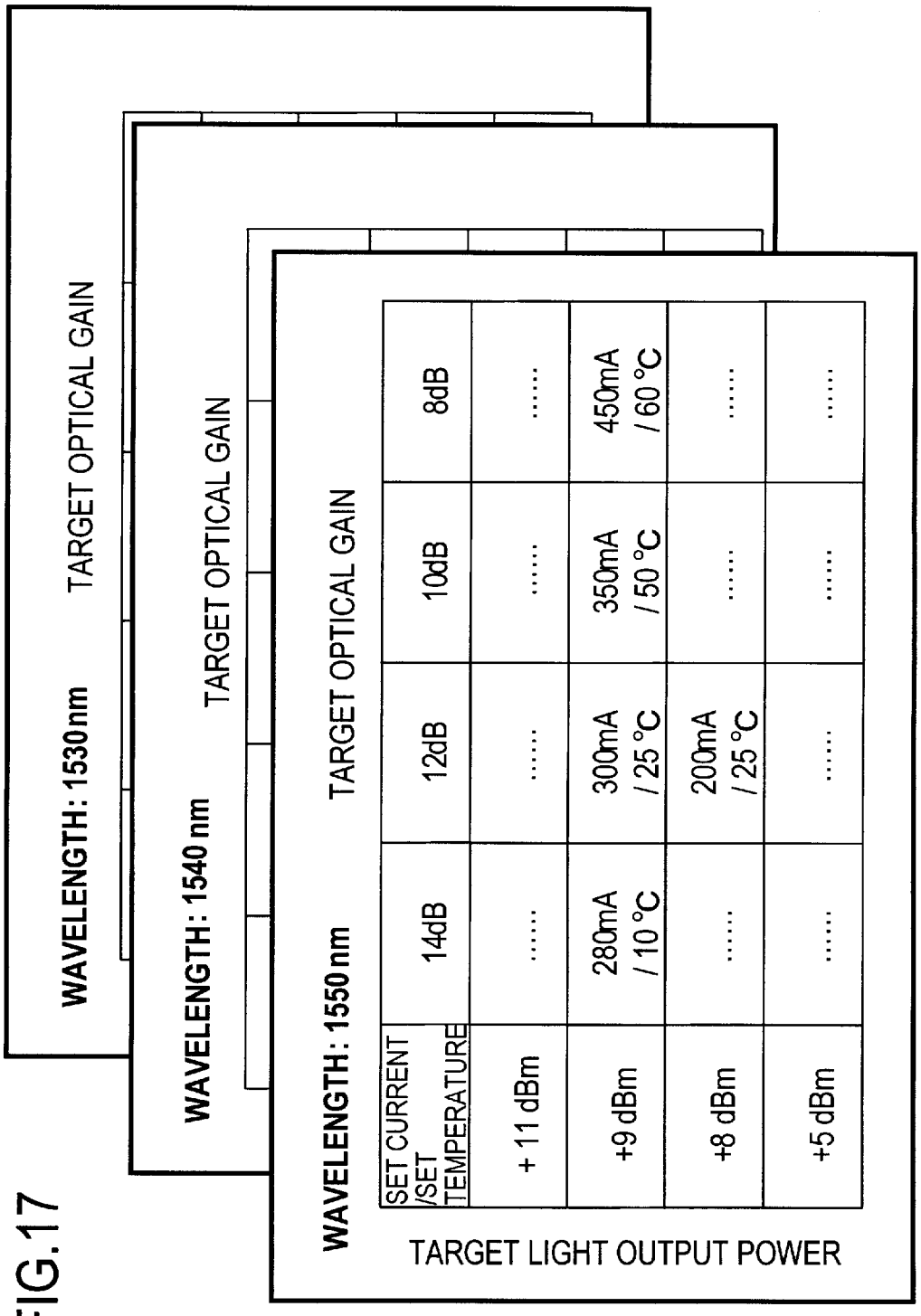
FIG. 17 is one example of a lookup table recorded in the optical gain control unit according to Embodiment 4.

FIG. 17 is one example of a lookup table 56 recorded in the optical gain control unit 54.

The lookup table 56 according to the present embodiment has target light output power smaller by 1 dBm each.

A reason that the target light output power is made smaller by 1 dBm each is to prevent the intensity ($I_{out}$) of the light output of the SOA 2 from immediately exceeding the range (10 dBm or smaller) capable of avoiding the pattern effect, even when the light intensity of the input light incident to the SOA 2 is varied. Therefore, according to the lookup table depicted in FIG. 17, it is tolerable if a variation of the light intensity of the input light is within 1 dB.

The third control is identical to the third control executed in the optical gain control unit 42 according to Embodiment 3.

(2) Operation

Next, the operation of the present optical amplification control apparatus 52 will be described according to the control method of the SOA 2 executed in the present optical amplification control apparatus.

First, the outline of the operation of the optical amplification control apparatus 52 will be described according to the control procedure of the SOA.

The outline of the control procedure of the present optical amplification control apparatus 52 is substantially identical to step S1 to step S3 described in Embodiment 3.

However, there is a different point in step S2 corresponding to the aforementioned second control. Therefore, description will be given on step S2, and description of the other steps is omitted.

First, a main portion of the operation of the optical amplification control apparatus 46 will be described.

The main portion of the operation of the present optical amplification control apparatus 46 may be divided into three steps (steps S1-S3). Step S1 to step S3 are operation executed by the optical gain control unit 48, according to the above-mentioned first to third control, respectively (for example, step S1 corresponds to the control 1). Such the operation has already been described in the above "(1) Configuration". Therefore, the description of step S1-S3 describing the main portion of the operation of the present optical amplification control apparatus 46 will be omitted.

Next, the detailed operation of the optical amplification control apparatus 46 will be described according to the control procedure of the SOA 2.

Figure 18:
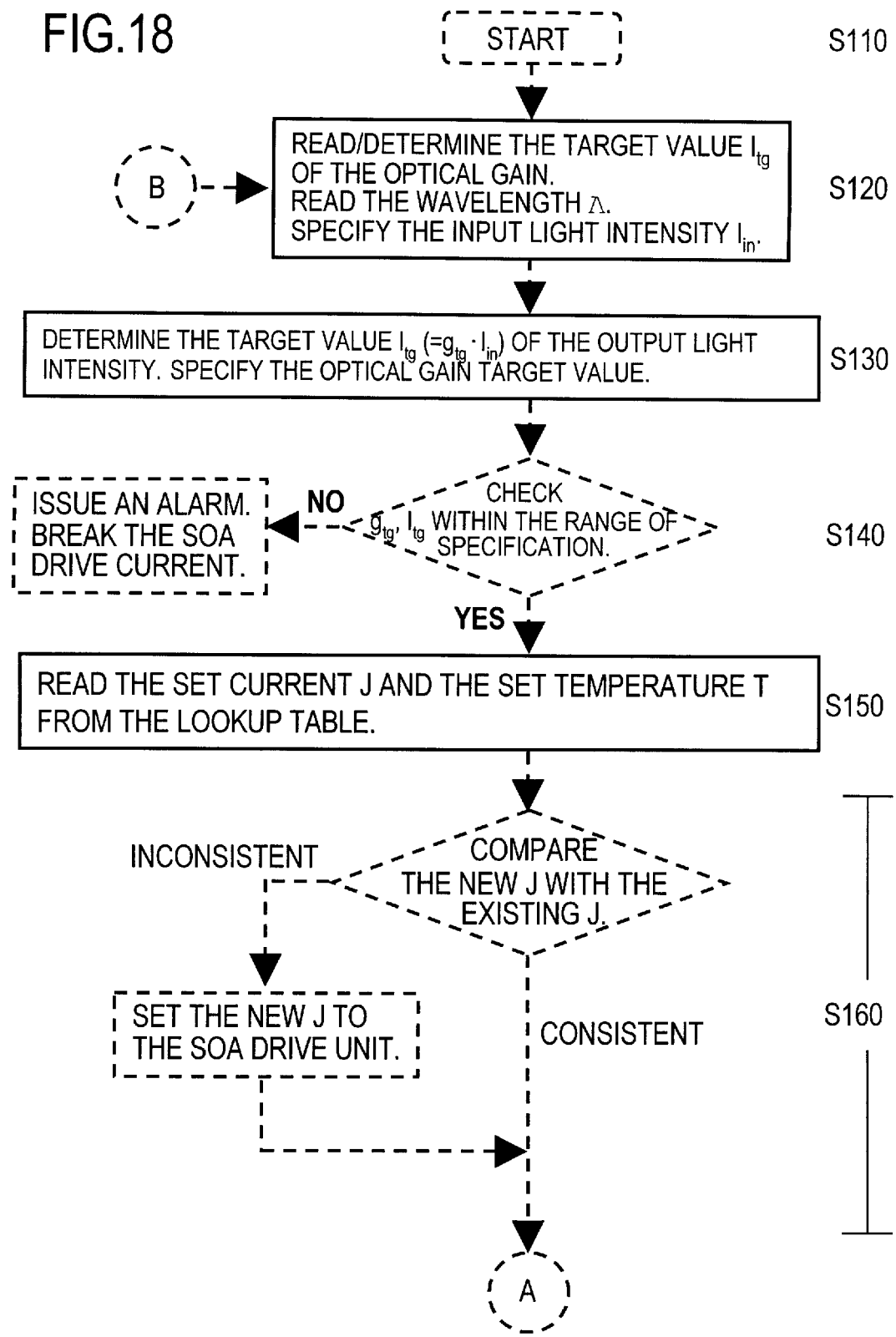
FIG. 18 is a flowchart illustrating the control procedure of the semiconductor optical amplifier to be executed in the optical amplification control apparatus according to Embodiment 4 (part 1).
Figure 19:
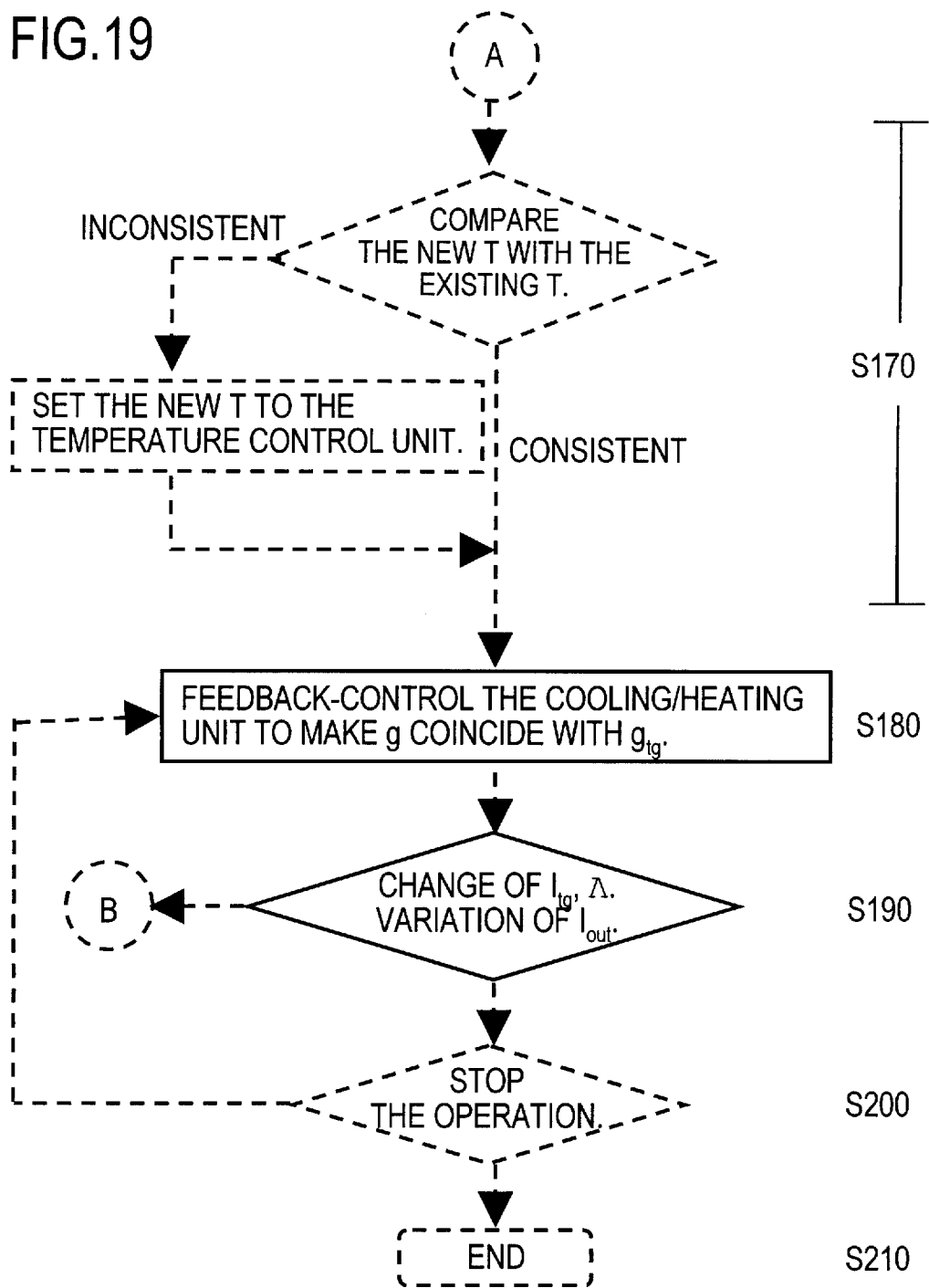
FIG. 19 is a flowchart illustrating the control procedure of the semiconductor optical amplifier to be executed in the optical amplification control apparatus according to Embodiment 4 (part 2).

FIG. 18 and FIG. 19 are flowcharts illustrating the control procedure of the semiconductor optical amplifier executed in the optical amplification control apparatus 52 according to the present embodiment.

The detail of the operation of the present optical amplification control apparatus 52 has a lot of points common to the operation of the optical amplification control apparatus 40 according to Embodiment 2.

Therefore, description hereafter will be made centering the points of difference from the operation of the optical amplification control apparatus 40 according to Embodiment 2, instead of Embodiment 3. The description of the steps common to the operation of Embodiment 2 described by reference to FIGS. 14 and 15 is omitted.

(i) Step S120

In the present step, the optical gain control unit 54 reads the target value of the optical gain of the SOA 2, and determines the read target value of the optical gain to be a target value ($g_{tg}$) of the optical gain which is one of the parameters to control the SOA 2.

Also, the optical gain control unit 54 reads the wavelength $\lambda$ of the input light (light to be amplified) incident to the SOA. Further, the optical gain control unit 54 determines the light intensity ($I_{in}$) of the input light (light to be amplified) incident to the SOA 2.

The target value ($g_{tg}$) of the optical gain and the wavelength $\lambda$ of the input light (light to be amplified) are reported to the optical gain control unit 54 by the external control signal 38. The light intensity ($I_{in}$) of the input light (light to be amplified) is detected by the optical gain control unit 54 when the output signal of the photodetector 24 on the input side is received.

Here, the target value ($g_{tg}$) of the optical gain is, for example, 12 dB. The light intensity ($I_{in}$) of the input light (light to be amplified) is, for example, −3 dBm. Also the wavelength $\lambda$ of the input light is, for example, 1,550 nm.

(ii) Step S130

In the present step, the optical gain control unit 54 determines a product ($g_{tg} \cdot I_{in}$) of the target value ($g_{tg}$) of the optical gain and the light intensity ($I_{in}$) of the input light (light to be amplified) to be a target value ($I_{tg}$) of the output light intensity of the SOA 2.

For example, the optical gain control unit 48 determines the target value ($I_{tg}$) of the output light to be 9 dBm (=−3 dBm+12 dB).

(iii) step S150

The present step is substantially identical to step S150 of Embodiment 2. However, a point that the table depicted in FIG. 17 is referred to as the lookup table is different from step S150 of Embodiment 2.

The drive current (J) and the set temperature (T) are 300 mA and 25° C., for example (refer to FIG. 17).

(iv) step S180

In the present step, the optical gain control unit 54 receives the outputs of the photodetector 24 on the input side and the photodetector 26 on the output side, and detects the light intensity ($I_{in}$) of the input light incident to the SOA 2 and the intensity ($I_{out}$) of the output light being output from the SOA 2.

Next, the optical gain control unit 54 controls the operation of the cooling/heating unit 8 so that the ratio of the above $I_{out}$ to $I_{in}$ (=$I_{out}/I_{in}$) becomes coincident with the target value (12 dB) of the optical gain.

More specifically, if the ratio of $I_{out}$ to $I_{in}$ (=$I_{out}/I_{in}$) is smaller than the target value (12 dB) of the optical gain, the temperature T of the cooling/heating unit 8 is decreased. On the other hand, if the ratio of $I_{out}$ to $I_{in}$ (=$I_{out}/I_{in}$) is greater than the target value (12 dB) of the optical gain, the temperature T of the cooling/heating unit 8 is increased. At this time, the drive current supplied to the SOA 2 is fixed to the set current (J; 300 mA, for example) supplied to the SOA 2 in step S160.

The above-mentioned procedure is repeated a predetermined number of times, and thereafter, the following step S190 is started.

(v) step S190

In the present step, the optical gain control unit 54 confirms whether the target value of the optical gain and the wavelength $\lambda$ of the input light (light to be amplified) incident to the SOA, which are read in step S120, are not changed, by referring to the external control signal 38 at the present time.

Further, the optical gain control unit 54 confirms whether the light intensity ($I_{out}$) of the amplified light being output from the SOA 2 departs from the target value ($I_{tg}$) of the light output power determined in step S130 by a predetermined value, for example 1 dB, or more.

As the result of the confirmation by the optical gain control unit 54, if any one of cases is satisfied among a case that the target value of the optical gain has been changed, a case that the wavelength $\lambda$ of the input light (light to be amplified) incident to the SOA has been changed, and a case that the intensity of the light output of the SOA 2 in operation departs from the target value ($I_{tg}$) of the light output power by 1 dB or more, the process returns to the aforementioned step 120.

Accordingly, even when the target value of the optical gain or the wavelength $\lambda$ of the input light (light to be amplified) is changed during the operation of the optical amplification control apparatus 40, the optical amplification control apparatus 40 may cope with the changed operating conditions.

Also, when the intensity of the light output of the SOA 2 in operation departs from the target value ($I_{tg}$) of the output light intensity by 1 dB or more, a new drive current (J) and a temperature (T) at which the SOA 2 is to be retained are set.

Accordingly, even when the difference between the saturation optical output power ($P_s$) of the SOA 2 and the output ($I_{out}$) of the SOA 2 becomes small during step S180, the difference concerned is restored immediately. Therefore, the pattern effect does not occur.

By the optical amplification control apparatus 52 according to the present embodiment, it is possible to set target light output power of 9 dBm relative to the target value ($g_{tg}$) of the optical gain of 8 dB (in the case that the tolerable variation of the output light intensity ($I_{out}$) is 1 dB).

On the other hand, in the optical amplification control apparatus according to Embodiment 3, in which the set current is fixed, the target light output power which may be set relative to the target value ($g_{tg}$) of the optical gain of 8 dB is 8 dBm (=9 dBm−1 dB) or lower.

As such, according to the optical amplification control apparatus 52, it is possible to set target light output power higher than the optical amplification control apparatus according to Embodiment 3 having no variation of the set current.

(Embodiment 5)

The present embodiment relates to an optical amplification control apparatus (optical amplifier module) having a cooling/heating unit composed of a heater disposed on an SOA and a thermoelectric cooling device having the SOA mounted thereon.

(1) Configuration

Figure 20:
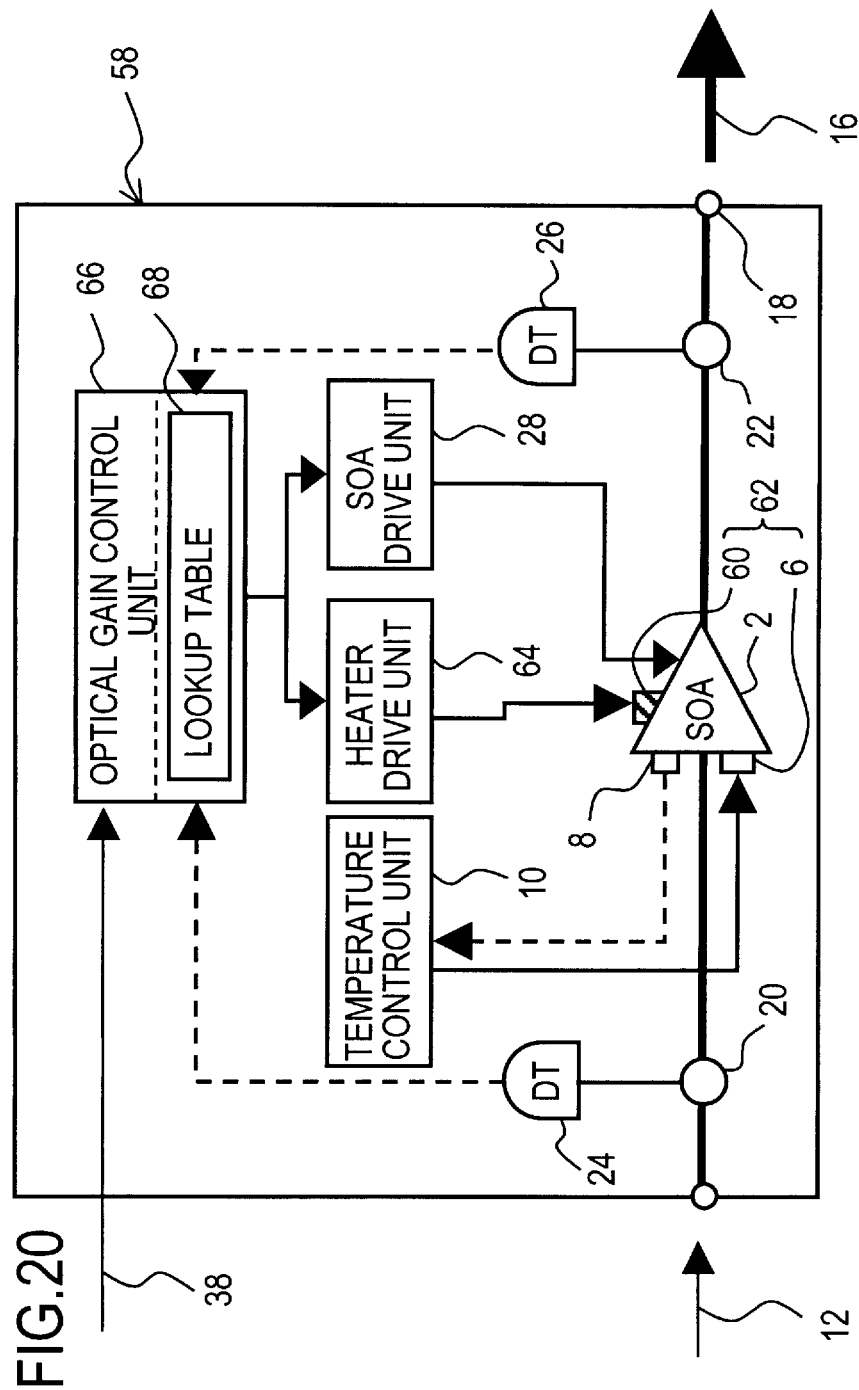
FIG. 20 is a diagram illustrating the configuration of the optical amplification control apparatus according to Embodiment 5.

FIG. 20 is a diagram illustrating the configuration of an optical amplification control apparatus 58 according to the present embodiment.

In Embodiments 1 to 4, the cooling/heating unit 36 is composed of the thermoelectric cooling device 6 only, having the SOA 2 mounted thereon.

In place of the above cooling/heating unit 36, the present optical amplification control apparatus 58 includes a cooling/heating unit 62 which is composed of a heater 60 disposed on the SOA 2 and a thermoelectric cooling device 6 having the SOA 2 mounted thereon.

Further, the present optical amplification control apparatus 58 includes a heater drive unit 64 for supplying drive current to the heater 60.

Similar to the optical amplification control apparatuses 32, 40, 46 and 52 according to Embodiments 1 to 4, the present optical amplification control apparatus 58 includes an optical gain control unit 66 for varying the optical gain of the SOA 2 by adjusting the operation of the cooling/heating unit 62. However, the control of the optical gain control unit 66, which is executed by the present optical amplification control apparatus 58, is partially different from the control of the optical gain control units 34, 42, 48 and 54 according to Embodiments 1 to 4.

Also, a lookup table 68 provided in the present gain control unit 66 is partially different from the lookup tables 35, 44, 50 and 56 of Embodiments 1 to 4.

(i) Configuration and operation of the cooling/heating unit.

First, the configuration and operation of the cooling/heating unit 62 will be described.

Figure 21:
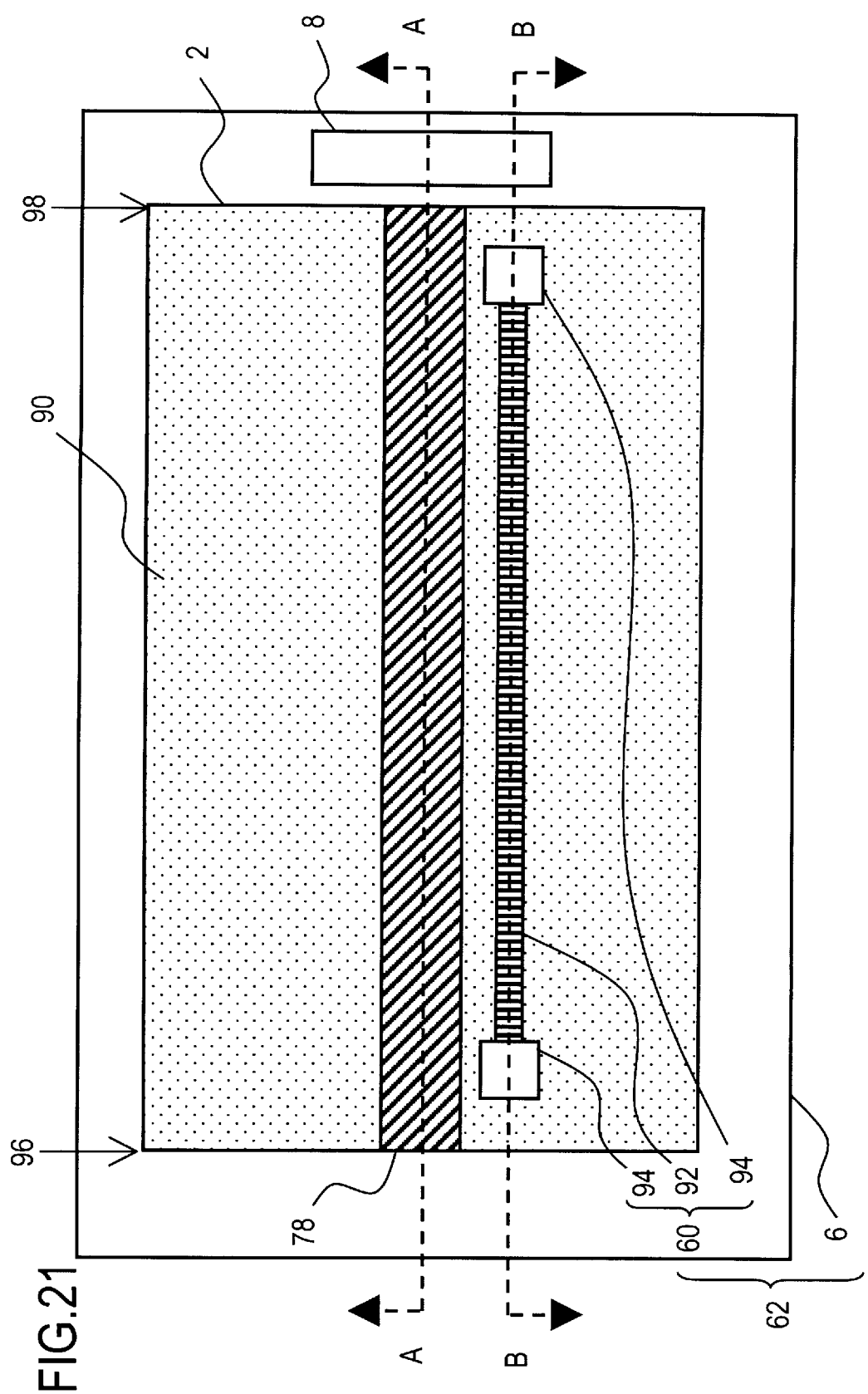
FIG. 21 is a plan view illustrating the configuration of a cooling/heating unit according to Embodiment 5.
Figure 22:
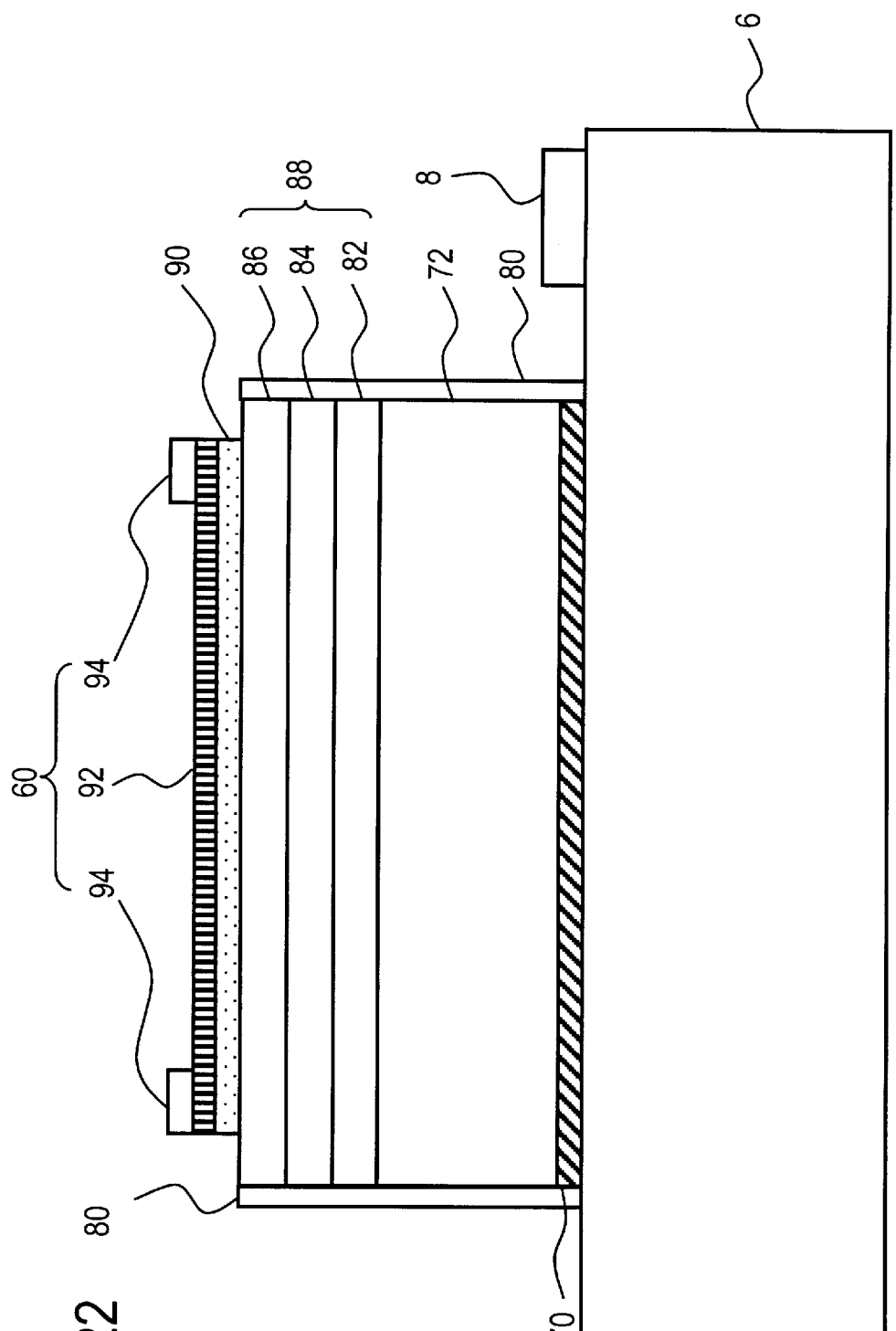
FIG. 22 is a cross sectional view of line A-A depicted in FIG. 20 when viewed from the arrow direction.
Figure 23:
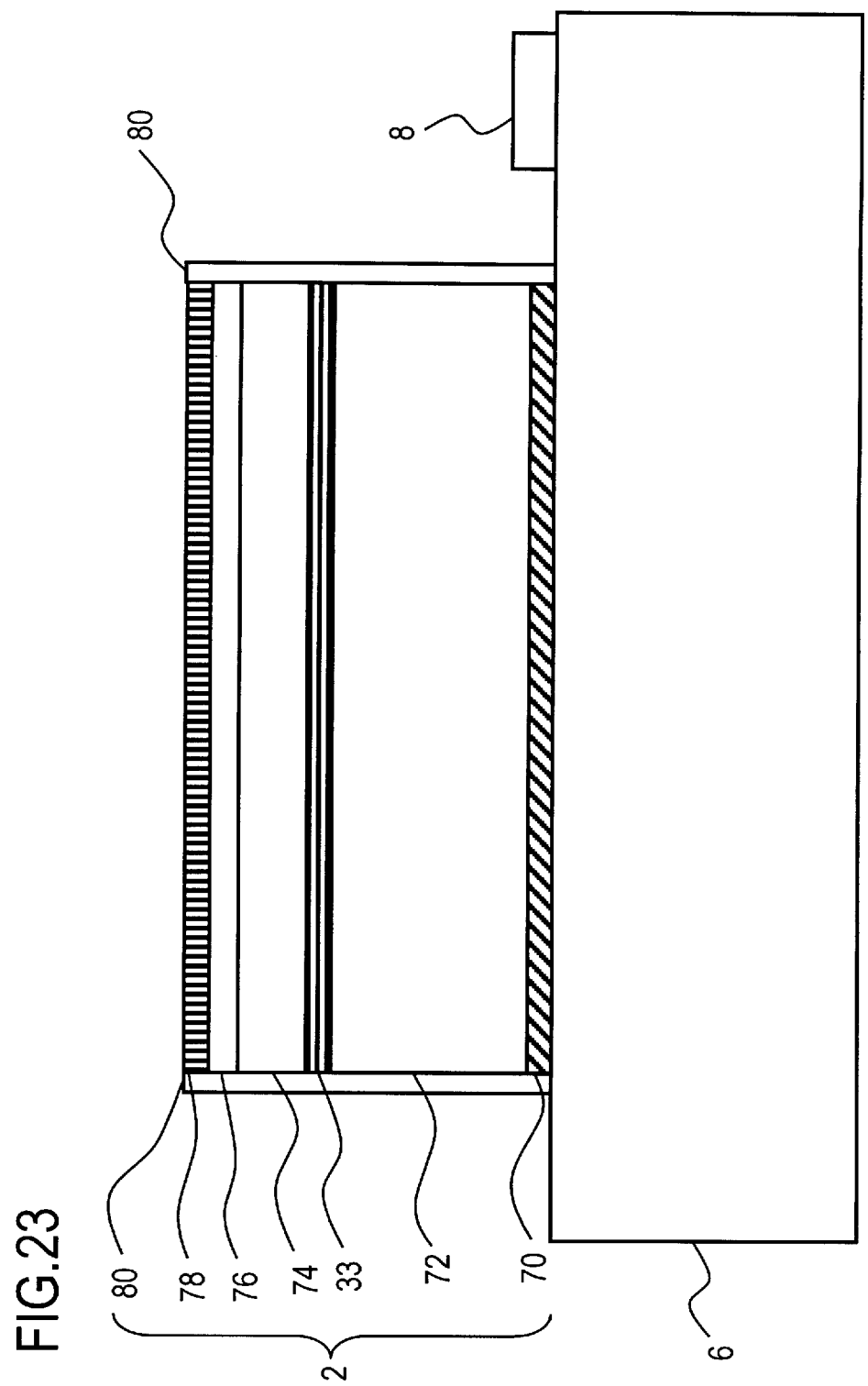
FIG. 23 is a cross sectional view of line B-B depicted in FIG. 20 when viewed from the arrow direction.

FIG. 21 is a plan view illustrating the configuration of the cooling/heating unit 62. FIG. 22 is across sectional view of line A-A depicted in FIG. 21 when viewed from the arrow direction. FIG. 23 is a cross sectional view of line B-B depicted in FIG. 21 when viewed from the arrow direction.

In FIG. 21 to FIG. 23, there is depicted the cooling/heating unit 62 in a state that the SOA 2 is mounted thereon.

As described earlier, the cooling/heating unit 62 includes the heater 60 disposed on the SOA 2 and the thermoelectric cooling device 6 having the SOA 2 mounted thereon. Additionally, the cooling/heating unit 62 is a kind of temperature adjustment unit for adjusting the temperature of the semiconductor optical amplifier 2.

Here, the SOA 2 is identical to the SOA configuring the optical amplification control apparatuses according to Embodiments 1 to 4.

More specifically, the SOA 2 includes an n-type InP substrate 72 having a thickness of 100 μm, a first electrode 70 formed on the rear face of the n-type InP substrate 72, and an active layer 33 composed of an InGaAsP multiple quantum well formed upward the n-type InP substrate 70 (refer to FIG. 23). Here, the peak of the gain of the active layer 33 exists in the vicinity of 1,480 nm.

Also, the SOA 2 includes an upper clad layer 74 composed of a p-type InP formed upward the active layer 33, an electrode layer 76 composed of a p-type InGaAsP, and a second electrode 78 formed on the electrode layer 76.

Further, on the incident end face and the output end face for the light in the SOA 2, antireflection films 80 are provided respectively.

Also, the active layer 33 to the electrode layer 76 are processed in ridge shapes, and both sides thereof are covered with a p-n-p current block layer 88, having a first p-type InP layer 82, an n-type InP layer 84 and a second p-type InP layer 86 successively laminated thereon. Here, the length along the waveguide direction of the light of the SOA 2 is 800 μm.

The first and second electrodes 70, 78 of the SOA 2 are connected to the SOA drive unit 28.

Further, the surface of the SOA 2 is covered with an insulating film 90 composed of, for example, $SiO_2$, except for the area in which the second electrode 78 is formed (refer to FIG. 21).

The heater 60 is formed on the insulating film 90. The heater 60 is formed along the active layer 33. An interval between the heater 60 and the active layer 33 is several μm.

The heater 60 is composed of a heater main body 92 formed of, for example, Ti, and heater electrodes 94 disposed on both ends of the heater main body 92. The heater electrode 94 is connected to the heater drive unit 64.

On the thermoelectric cooling device 6, the temperature sensor 8 is mounted for detecting the temperature of the thermoelectric cooling device 6. Further, the thermoelectric cooling device 6 and the temperature sensor 8 are connected to the temperature control unit 10.

According to an instruction from the optical gain control unit 66, the temperature control unit 10 fixes the temperature of the thermoelectric cooling device 6 at a constant value (10° C., for example), using the output of the temperature sensor 8 as a feedback signal.

Accordingly, the temperature of the back face (the first electrode 70) of the SOA 2 in contact with the thermoelectric cooling device 6 is also fixed at the above constant value (10° C., for example).

Meanwhile, the active layer 33 is heated by the heater 60 disposed in the immediate vicinity. Therefore, it becomes possible to set the temperature of the active layer 33 at a desired value by adjusting electric power supplied to the heater 60.

A temperature change of the active layer 33 at this time is rapid, and it is possible to make the temperature of the active layer 33 reach the desired temperature within several μ seconds. The optical gain and the saturation optical output power of the SOA 2 depend on the temperature of the active layer 33. Accordingly, by means of the optical amplification control apparatus 62 according to the present embodiment, the optical gain may be varied at high speed in the order of μ second.

(ii) Control of the optical gain control unit

The control executed by the optical gain control unit 66 is basically identical to the control executed by the optical gain control units 35, 44, 50 and 56 according to Embodiments 1 to 4.

However, the control of the present optical gain control unit 66 differs from the control of the optical gain control units 35, 44, 50 and 56 according to Embodiments 1 to 4 in a point that the operating point to operate the cooling/heating unit 62 is a current value ($J_h$) supplied to the heater 60, instead of the temperature (T) of the cooling/heating unit 62.

Namely, the operating point at which the present optical gain control unit 66 controls the cooling/heating unit 62 according to the second control is not the temperature (T) of the cooling/heating unit 62, but the current ($J_h$) supplied to the heater 60.

Further, the control of the present optical gain control unit 66 also differs from the control of the optical gain control unit according to Embodiments 1 to 4 in a point that a physical amount to feedback-control the operation of the cooling/heating unit 62 according to the third control is a current supplied to the heater 60.

Here, the operation of the heater drive unit 64 to supply current to the heater 60 is controlled by the optical gain control unit 66.

Additionally, the optical gain control unit 66 may be either a unit performing APC control on the SOA 2, or a unit performing AGC control. Also, the optical gain control unit 66 may be a control device (refer to Embodiment 1 or 3) which varies the operating point of the cooling/heating unit 62 with the drive current (J) supplied to the SOA 2 maintained constant. Alternatively, the optical gain control unit 66 may be a control device (refer to Embodiment 2 or 4) which also varies the set current (J) of the SOA 2.

(iii) Lookup Table

FIG. 24 is one example of the lookup table 68 recorded in the optical gain control unit according to Embodiment 5. The lookup table 68 is provided to use the cooling/heating unit 62 in a state that the temperature thereof is maintained at 25° C.

As depicted in FIG. 24, the lookup table 68 has the recorded combinations of the drive current (J) of the SOA 2 and the operating point of the cooling/heating unit 62, so as to operate the SOA 2 in a non-saturated output power state and to make the optical gain of the SOA 2 coincide with the optical gain to be targeted (target optical gain). Here, the operating point of the cooling/heating unit 62 is not the temperature (T) of the cooling/heating unit 62, but the current (set heater current) supplied to the heater 60.

Figure 25:
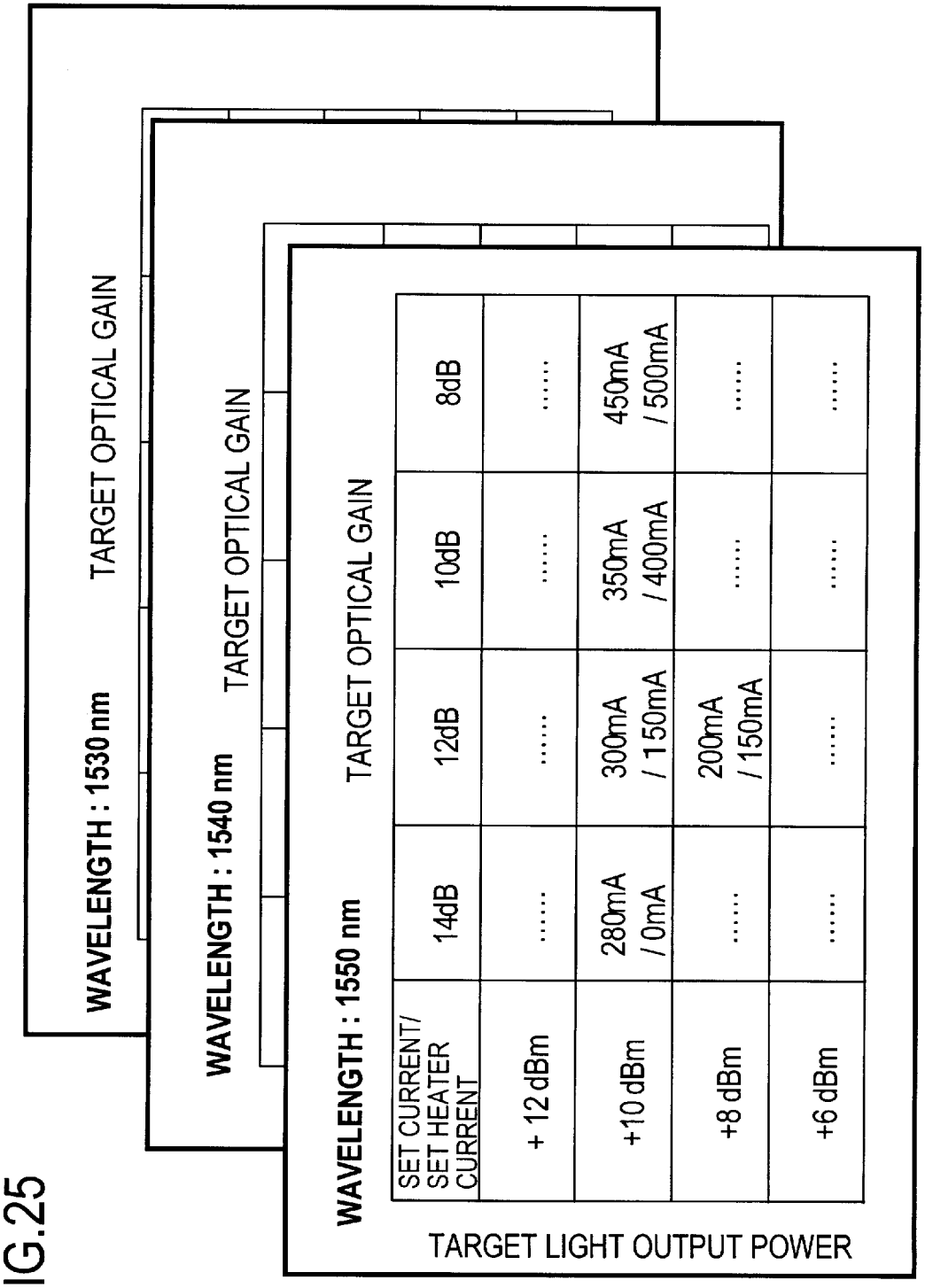
FIG. 25 is another example of the lookup table recorded in the optical gain control unit according to Embodiment 5.

FIG. 25 is another example of the lookup table 66 recorded in the optical gain control unit according to Embodiment 5.

The lookup table includes the record of the drive current of the SOA 2 and the current to be supplied to the heater so as to make the optical gain of the SOA 2 coincide with the optical gain to be targeted (target optical gain), and to make the output light intensity of the SOA 2 coincide with the output light intensity to be targeted (target light output power).

Here, the set current and the set heater current signify the drive current of the SOA 2 and the current supplied to the heater.

When using the lookup table depicted in FIG. 25, it is necessary that the temperature of the cooling/heating unit 62 is maintained at 10° C.

(2) Operation

Next, the operation of the optical amplification control apparatus 58 will be described, according to the control method of the SOA 2 executed in the present optical amplification control apparatus 58.

The control method of the SOA 2 executed in the optical amplification control apparatus 58 may be of the same type as any of the control methods of the SOA 2 executed in Embodiments 1 to 4. Because it is complicated to describe the entire control methods, description will be given only on the control method executed in Embodiment 2 (APC control).

Figure 26:
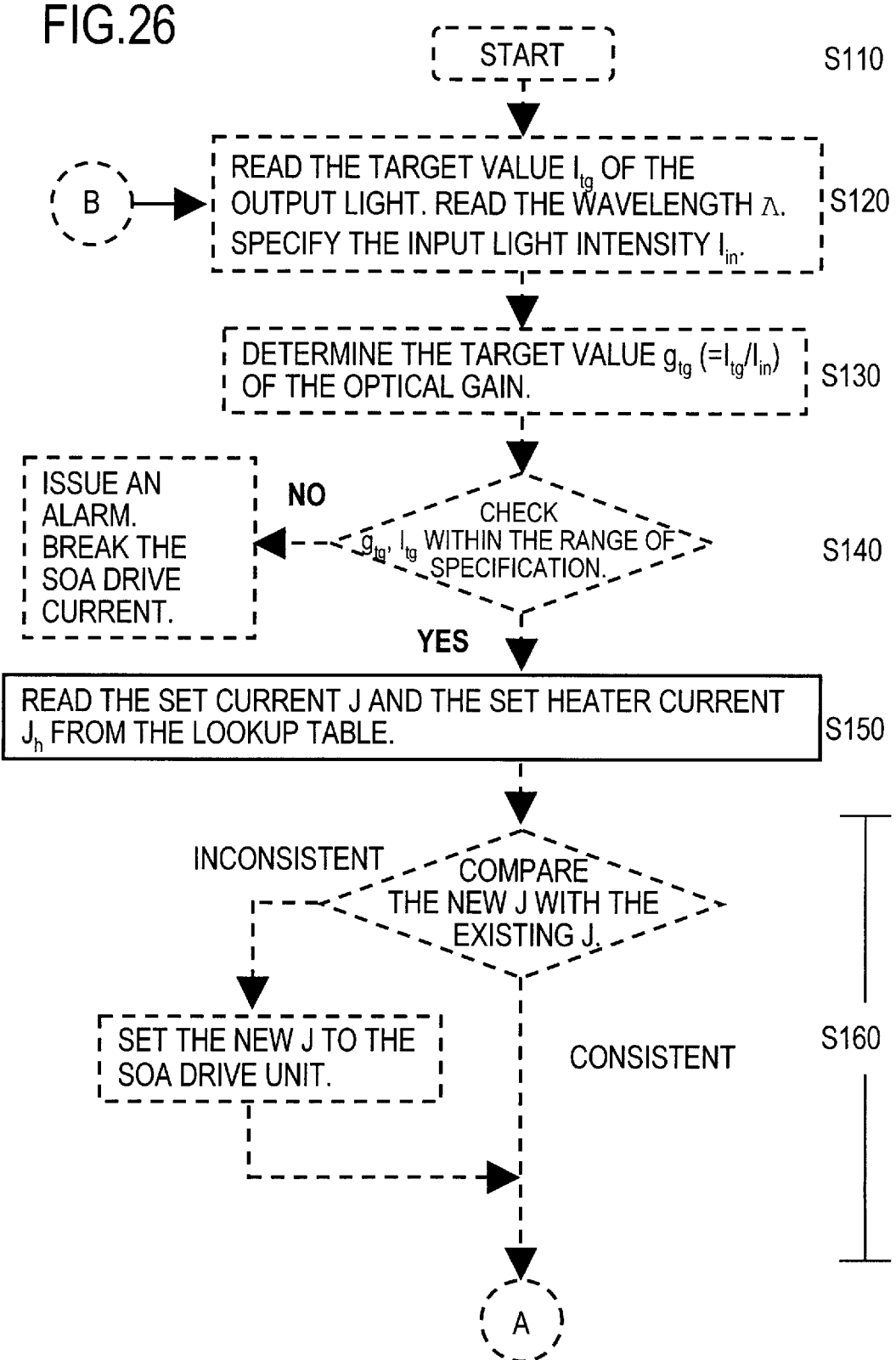
FIG. 26 is a flowchart illustrating one example of the control procedure of the semiconductor optical amplifier in the optical amplification control apparatus, according to Embodiment 5 (part 1).
Figure 27:
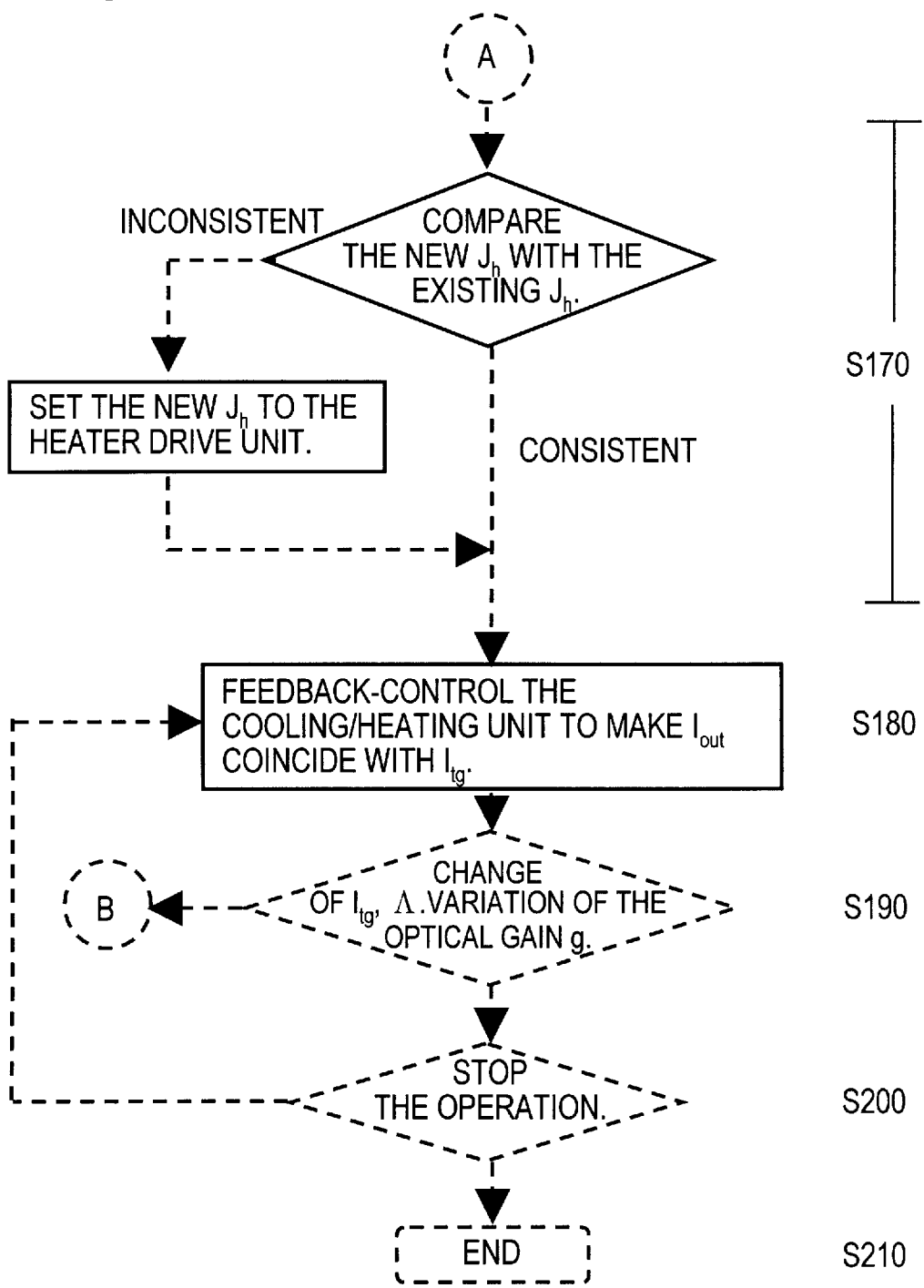
FIG. 27 is a diagram illustrating one example of the control procedure of the semiconductor optical amplifier in the optical amplification control apparatus, according to Embodiment 5 (part 2).

FIG. 26 and FIG. 27 are flowcharts illustrating the procedure of the control method executed in the present optical amplification control apparatus 58.

The procedure of the present control method differs from the control procedure, which was described in Embodiment 2 by reference to FIGS. 14 and 15, in step S150, step S170 and step S180, while other steps are substantially identical. However, the present control procedure is different from the control procedure executed in Embodiment 2 in a point that the temperature control unit 10 continuously retains the temperature of the thermoelectric cooling device 6 at a constant value (10° C., for example).

Accordingly, description will be given on the above steps, while the description of the other steps is omitted.

(i) Step S150

In the present step, the optical gain control unit 66 reads the set current (J) and the set heater current ($J_h$) from the lookup table 68. In other points, the present step is substantially identical to step S150 of Embodiment 2.

(ii) Step S170

In the present step, the optical gain control unit 42 compares the current (set heater current $J_h$) to be supplied to the heater 60, which is specified in step S150, with the current (0 mA, for example) having been supplied to the heater 60 before the execution of the present step.

As the result of comparison, if both are coincident, the optical gain control unit 42 maintains the current (0 mA, for example) to be supplied to the heater 60.

On the other hand, if both are not coincident, the optical gain control unit 42 retains the heater 60 with the current (150 mA, for example) to be supplied to the heater 60, which is specified in step S150.

(iii) Step S180

In the feedback control of the cooling/heating unit 62 executed in the present step, a physical amount to be feedback-controlled is not the temperature of the SOA 2 (cooling/heating unit 62), but the current supplied to the heater 60, In other points, the present step is substantially identical to step S180 of Embodiment 2.

As described earlier, by adjusting the current supplied to the heater 60, it is possible to vary the optical gain (and the saturation optical output power) of the SOA 2 in the µ second order.

Accordingly, by the present optical amplification control apparatus 58, it is possible to control the SOA at high speed.

(Embodiment 6)

The present embodiment relates to an optical amplification control apparatus (optical amplifier module) in which the cooling/heating unit heats the central portion of the SOA 2 to a higher temperature in Embodiment 5.

The saturation optical output power of the SOA is determined by the state of the active layer 33 in the light output end vicinity 98, where intensity of the amplified light propagating in the SOA becomes large. Namely, the lower the temperature in the light output end vicinity 98 is, the greater the saturation optical output power is.

Meanwhile, the noise of the SOA 2 is determined by the state of the active layer 33 in the light input end vicinity 96, which is a main generation position of amplified spontaneous emission (ASE). Namely, the lower the temperature in the light input end vicinity 96 is, the smaller the SOA noise is.

The heater of the optical amplification control apparatus according to the present embodiment is formed in such a manner that the inner side of the incident end 96 and the output end 98 of the light of the SOA maybe heated to a higher temperature than the incident end and the output end, respectively. Therefore, according to the optical amplification control apparatus of the present embodiment, it is possible to increase the light intensity of the amplified light and decrease the noise of the amplified light.

In order to produce a high temperature at the inner side of both the vicinity of the incident end 96 and the vicinity of the output end 98, the both ends of the heater 60 may be formed, for example, 100 μm apart from the incident end 96 and the output end 98 of the SOA (refer to FIG. 21).

Alternatively, the heater provided on the SOA 2 may be divided into three portions which are respectively disposed on the incident end side of the light of the SOA 2, the inner side and the output end side of the light.

Figure 28:
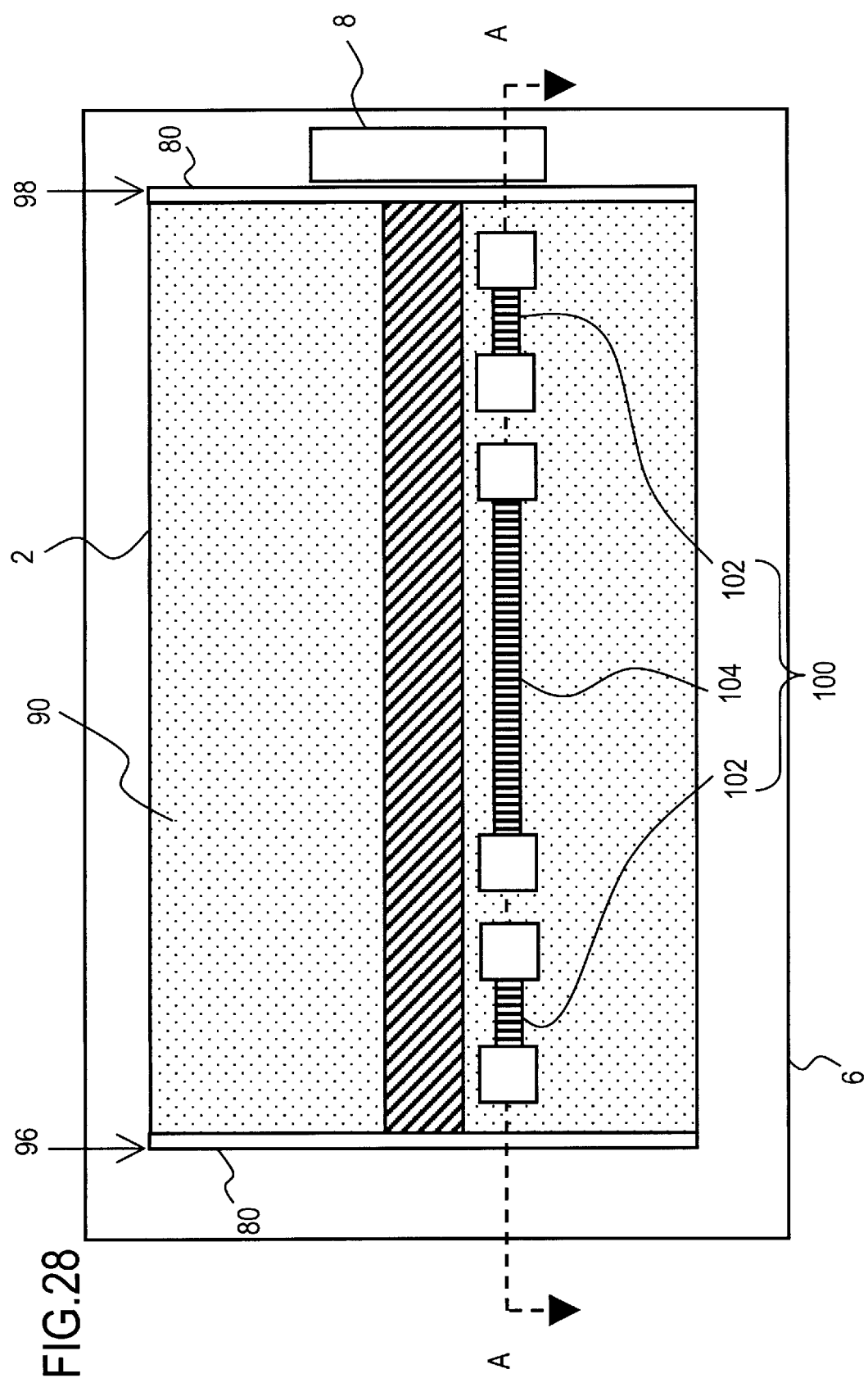
FIG. 28 is a plan view illustrating the configuration of the cooling/heating unit according to Embodiment 5.
Figure 29:
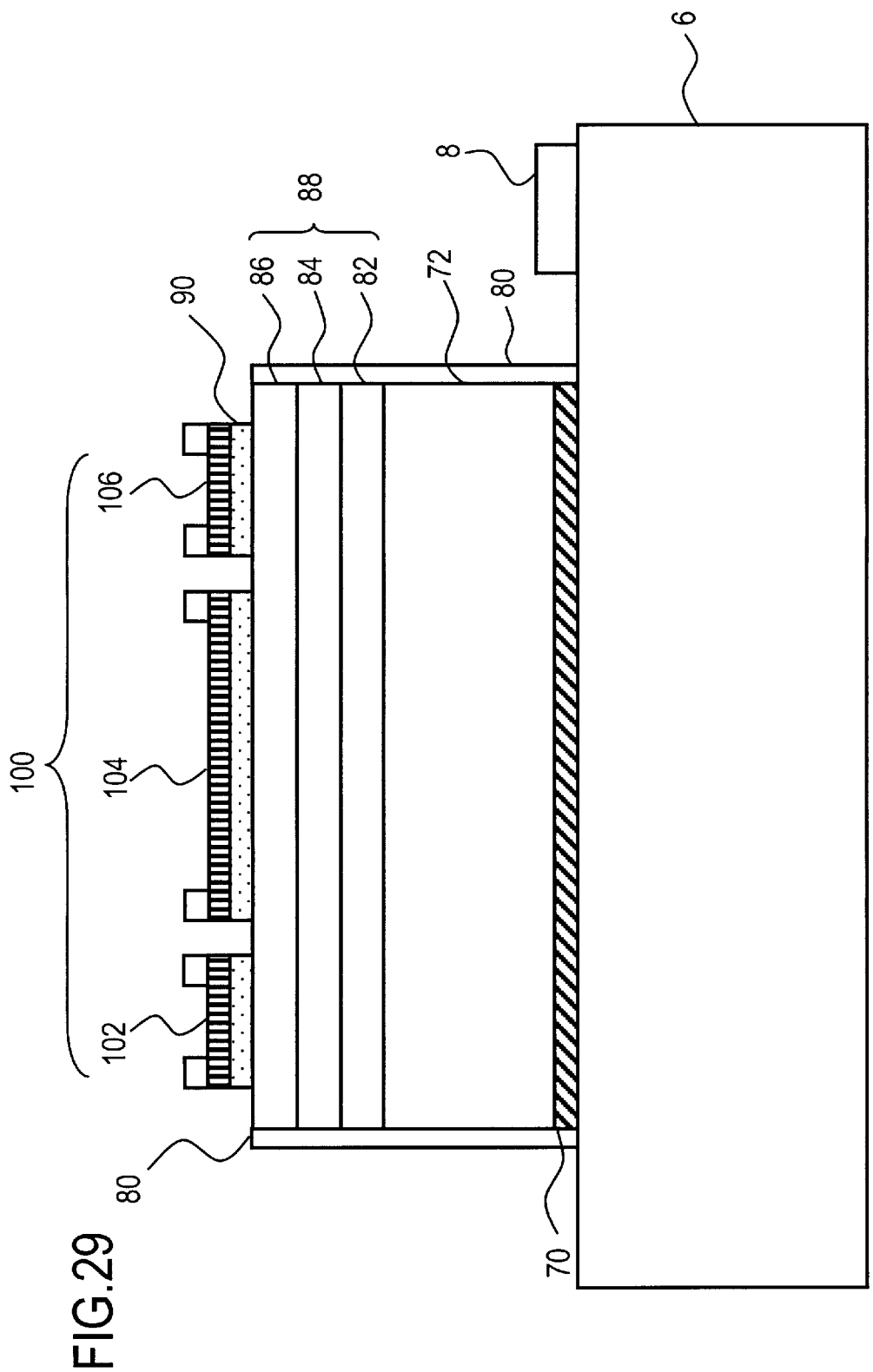
FIG. 29 is a cross sectional view of line A-A depicted in FIG. 20 when viewed from the arrow direction.

FIG. 28 is a plan view illustrating a state that such a heater (divided heater) 100 is disposed on the SOA 2. FIG. 29 is a cross sectional view at line A-A depicted in FIG. 28 when viewed from the arrow direction.

As depicted in FIG. 28 and FIG. 29, the above heater 100 is composed of a heater 102 on the light input end side, an inner heater 104 and a heater 106 on the light output end side. Here, each length of the heater 102 on the light input end side and the heater 106 on the light output end side is 100 μm, for example. In contrast, the length of the inner heater 104 is 500 μm.

The configuration of the optical amplification control apparatus according to the present embodiment is substantially identical to the configuration of the optical amplification control apparatus according to Embodiment 5, except that the heater 62 forming the cooling/heating unit is formed by the aforementioned heater. However, when the cooling/heating unit 36 is composed of the divided heater 100, a heater drive unit for driving both the heater 102 on the light input end side and the heater 106 on the light output end side is provided separately from the heater drive unit 64 for driving the inner heater 104.

The operation of the optical amplification control apparatus (and the control method of the SOA) according to the present embodiment is substantially identical the operation (and the control method of the SOA) according to Embodiment 5.

Here, in case of using the cooling/heating unit composed of the heater 100 which is described by reference to FIGS. 28 and 29, the heater drive unit 64 drives the inner heater 104. On the other hand, to the heater 102 on the light input end side and the heater 106 on the light output end side, a current smaller than the current supplied to the inner heater 104 is supplied from the other heater drive unit (not depicted).

(Embodiment 7)

The present embodiment relates to optical transmission equipment having the optical amplification control apparatus described in any one of the above-mentioned embodiments.

(1) Configuration

Figure 30:
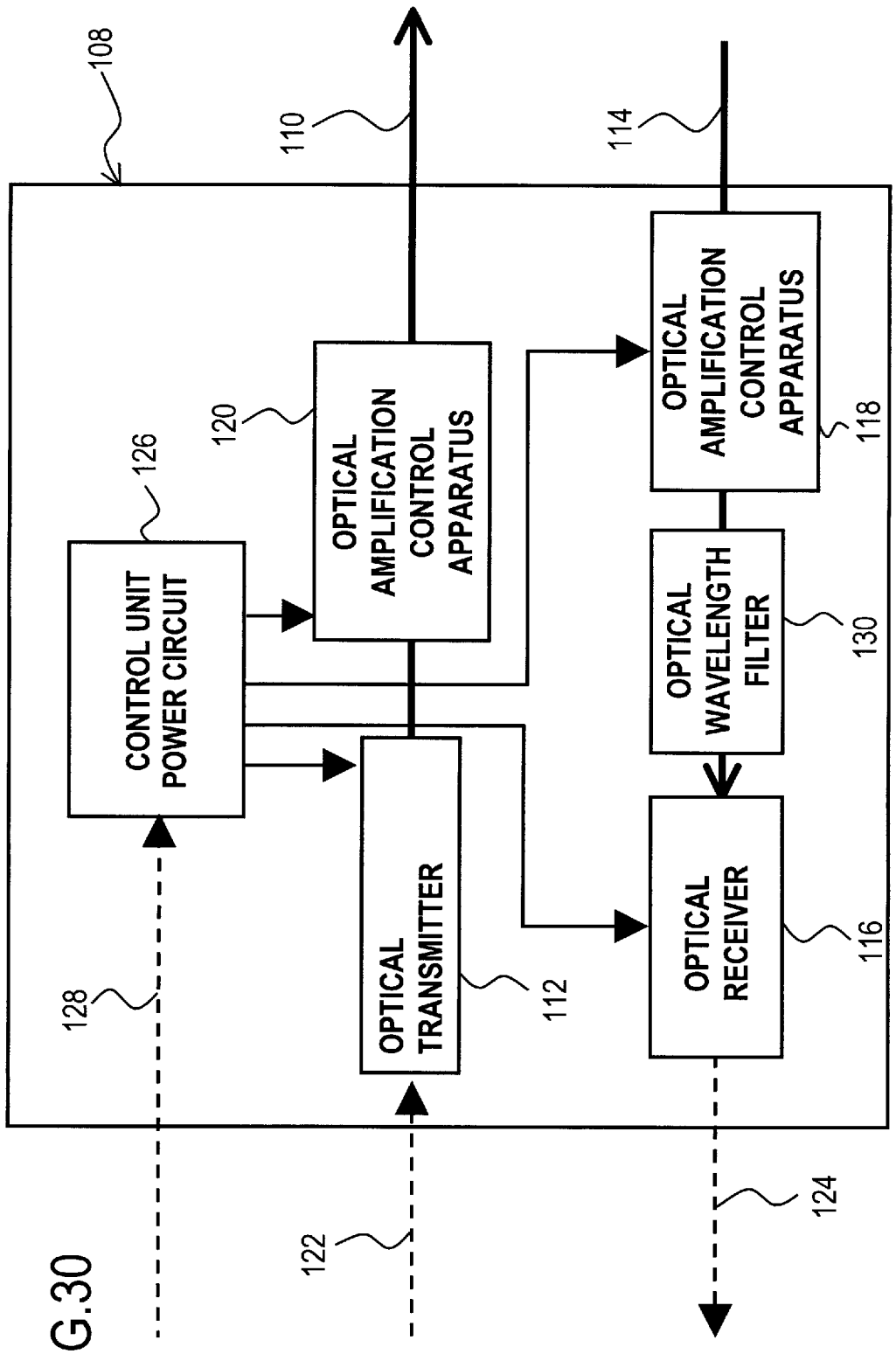
FIG. 30 is a block diagram illustrating the configuration of the optical transmission equipment (transceiver) according to Embodiment 7.

FIG. 30 is a block diagram illustrating one exemplary configuration of the optical transmission equipment (transceiver) according to the present embodiment.

Optical transmission equipment (transceiver) 108 according to the present embodiment includes a first optical amplification control apparatus 118 for amplifying an incident optical signal 114, and a second optical amplification control apparatus 120 for amplifying an output optical signal 110, as an example.

Also, the optical transmission equipment (transceiver) 108 according to the present embodiment includes an optical transmitter 112 for generating and outputting an optical signal 110 to be output, and an optical receiver 116 for receiving and decoding an incident optical signal 114.

Here, the optical transmitter 112 is, for example, a modulator-integrated semiconductor laser, which photoelectrically converts a transmission data (electric signal) 122 into an optical signal. Further, the optical receiver 116 includes a photodetector for photoelectrically converting the incident optical signal 114, and a code decision circuit for decoding the output of the above photodetector. The above code decision circuit outputs a decorded reception data signal (electric signal) 124.

Further, by means of the first optical amplification control apparatus 120, the optical transmission equipment (transceiver) 108 according to the present embodiment amplifies and outputs the optical signal which is generated and output from the optical transmitter 112.

Also, in the present optical transmission equipment (transceiver) 108, the second optical amplification control apparatus 118 amplifies the incident optical signal 114, which is then received and decoded by the optical receiver 116.

Here, the first and second optical amplification control apparatuses 118, 120 are APC controlled.

Further, the present optical transmission equipment (transceiver) 108 includes a control unit 126 for controlling the operation of the optical transmitter 112, the optical receiver 116 and the first and second optical amplification control apparatuses 118, 120, according to each instruction of the external control signal 128.

Further, the present optical transmission equipment (transceiver) 108 includes an optical wavelength filter 130 for eliminating amplified spontaneous emission (ASE) generated in the first optical amplification control apparatus 118.

Additionally, each signal light propagation path in the present optical transmission equipment (transceiver) 108 is composed of an optical fiber.

(2) Operation

Next, the operation of the present optical transmission equipment (transceiver) 108 will be described.

By means of the first optical amplification control apparatus 118 which operates according to an instruction of the control unit 126, the optical signal 114 incident to the present optical transmission equipment (transceiver) 108 is amplified to predetermined light intensity.

The optical signal 114 amplified by the first optical amplification control apparatus 118 is received by the optical receiver 116 after the amplified spontaneous emission (ASE) is eliminated by the optical wavelength filter 130.

Thereafter, the optical receiver 116 photoelectrically converts the received optical signal 114 according to an instruction from the control unit 126, and after decoding, outputs as the received data signal (electric signal) 124.

On the other hand, according to an instruction from the control unit 126, the optical transmitter 112 converts the externally supplied transmission data signal (electric signal) 122 into the optical signal 110, and outputs the converted signal. According to an instruction from the control unit 126, the second optical amplification control apparatus 120 amplifies and outputs the optical signal output from the optical transmitter 112 to predetermined light intensity.

Because the optical transmission equipment according to the present embodiment amplifies signal light by the optical amplification control apparatus according to Embodiments 1 to 6, it is possible to increase the light intensity of the signal light. Accordingly, the optical transmission equipment according to the pre sent embodiment has large output power (intensity of transmission light), as well as high sensitivity to the input light (intensity of reception light).

The examples in the above description relates to optical transmission equipment (so-called transceiver) performing both transmission and reception of optical signals. However, the optical amplification control apparatuses according to Embodiments 1 to 6 may also be applicable to optical transmission equipment (so-called transmitter) which performs optical signal transmission only, or optical transmission equipment (so-called receiver) which performs optical signal reception only.

Also, the optical amplification control apparatuses according to Embodiments 2 or 4 may be applicable to inline optical amplification equipment, or an optical repeater (transponder).

By implementing a metro access network and a datacom using any one of the aforementioned optical transmission equipment, it is possible to obtain a small-sized system with a low cost.

Additionally, in order to increase the suppression effect against the pattern effect, it may also be possible to inject a light, having a different wavelength from the signal light, into the SOA 2 which configures the aforementioned Embodiment 1 to 6.

The invention claimed is:

1. An optical amplification control apparatus comprising:
a semiconductor optical amplifier;
a temperature adjustment unit which adjusts a temperature of the semiconductor optical amplifier;
an optical gain control unit which varies an optical gain of the semiconductor optical amplifier by controlling the temperature adjustment unit to adjust a temperature of the semiconductor optical amplifier; and
a drive unit which applies current to the semiconductor optical amplifier,
wherein, based on a combination of the temperature and the drive current, which corresponds to a target value of the optical gain intended to be generated in the semiconductor optical amplifier, the optical gain control unit varies the optical gain of the semiconductor optical amplifier by controlling the drive unit and the temperature adjustment unit; and
the drive current is constant.

2. An optical amplification control apparatus comprising:
a semiconductor optical amplifier;
a temperature adjustment unit which adjusts a temperature of the semiconductor optical amplifier;
an optical gain control unit which varies an optical gain of the semiconductor optical amplifier by controlling the temperature adjustment unit to adjust a temperature of the semiconductor optical amplifier; and
a drive unit which applies a drive current to the semiconductor optical amplifier,
wherein, based on a target value of the optical gain intended to be generated in the semiconductor optical amplifier, the optical gain control unit determines the drive current and the temperature, and varies the optical gain of the semiconductor optical amplifier by controlling the drive unit and the temperature adjustment unit based on the determined drive current and the determined temperature; and
the determined drive current and the determined temperature are a combination to maintain a difference between a saturation optical output power of the semiconductor optical amplifier and a target of an output light intensity of the semiconductor optical amplifier to be constant.

3. An optical amplification control apparatus comprising:
a semiconductor optical amplifier;
a temperature adjustment unit which adjusts a temperature of the semiconductor optical amplifier;
an optical gain control unit which varies an optical gain of the semiconductor optical amplifier by controlling the temperature adjustment unit to adjust a temperature of the semiconductor optical amplifier; and
a drive unit which applies a drive current to the semiconductor optical amplifier,
wherein the optical gain control unit feedback-controls the temperature adjustment unit so that an output light intensity output from the semiconductor optical amplifier becomes coincident with a target value of the output light intensity, while keeping the drive current of the semiconductor optical amplifier fixed.

4. An optical amplification control apparatus comprising:
a semiconductor optical amplifier;
a temperature adjustment unit which adjusts a temperature of the semiconductor optical amplifier;
an optical gain control unit which varies an optical gain of the semiconductor optical amplifier by controlling the temperature adjustment unit to adjust a temperature of the semiconductor optical amplifier; and
a drive unit which applies a drive current to the semiconductor optical amplifier,
wherein the optical gain control unit feedback-controls the temperature adjustment unit so that a ratio of an output light intensity output from the semiconductor optical amplifier relative to an input light intensity incident to the semiconductor optical amplifier becomes coincident with a target value of an optical gain, while keeping the drive current of the semiconductor optical amplifier fixed.

5. An optical amplification control apparatus comprising:
a semiconductor optical amplifier;
a temperature adjustment unit which adjusts a temperature of the semiconductor optical amplifier; and
an optical gain control unit which varies an optical gain of the semiconductor optical amplifier by controlling the temperature adjustment unit to adjust a temperature of the semiconductor optical amplifier,
wherein the temperature adjustment unit is a heater provided on the semiconductor optical amplifier and the thermoelectric cooling device having the semiconductor optical amplifier mounted thereon;
the heater includes a first heater disposed on a light input end side of the semiconductor optical amplifier, a second heater disposed on a light output end side of the semiconductor optical amplifier, and a third heater disposed between the first heater and the second heater.

* * * * *